United States Patent
Park

(10) Patent No.: US 10,176,852 B2
(45) Date of Patent: Jan. 8, 2019

(54) SEMICONDUCTOR MEMORY DEVICES, METHODS OF OPERATION, AND MEMORY SYSTEMS HAVING REDUCED DECODER WIDTH AND CORE SKEW

(71) Applicant: SAMSUNG ELECTRONICS CO., LTD., Suwon-si, Gyeonggi-Do (KR)

(72) Inventor: Min-Sang Park, Yongin-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/656,050

(22) Filed: Jul. 21, 2017

(65) Prior Publication Data
US 2018/0158494 A1 Jun. 7, 2018

(30) Foreign Application Priority Data
Dec. 7, 2016 (KR) ........................ 10-2016-0165463

(51) Int. Cl.
| | | |
|---|---|---|
| *G11C 8/00* | (2006.01) | |
| *G11C 7/10* | (2006.01) | |
| *G11C 7/12* | (2006.01) | |
| *G11C 7/22* | (2006.01) | |
| *G11C 8/10* | (2006.01) | |
| *G11C 8/18* | (2006.01) | |
| *G11C 5/14* | (2006.01) | |

(Continued)

(52) U.S. Cl.
CPC ............ *G11C 7/1027* (2013.01); *G11C 5/025* (2013.01); *G11C 5/14* (2013.01); *G11C 7/1087* (2013.01); *G11C 7/12* (2013.01); *G11C 7/22* (2013.01); *G11C 8/10* (2013.01); *G11C 8/12* (2013.01); *G11C 8/18* (2013.01); *G11C 11/4076* (2013.01); *G11C 11/4085* (2013.01); *G11C 11/4087* (2013.01); *G11C 11/4091* (2013.01); *G11C 11/4094* (2013.01); *G11C 29/00* (2013.01); *G11C 5/063* (2013.01); *G11C 7/065* (2013.01); *G11C 11/4074* (2013.01); *G11C 2207/005* (2013.01)

(58) Field of Classification Search
CPC ......................................................... G11C 8/10
USPC ..................................................... 365/230.06
See application file for complete search history.

(56) References Cited

U.S. PATENT DOCUMENTS

| | | | |
|---|---|---|---|
| 6,388,937 B2 | 5/2002 | Takeyama et al. | |
| 6,876,557 B2 | 4/2005 | Hsu et al. | |

(Continued)

*Primary Examiner* — Hoai V Ho
(74) *Attorney, Agent, or Firm* — F. Chau & Associates, LLC

(57) ABSTRACT

A semiconductor memory device includes bank arrays, row decoders, column decoders, a timing control circuit and repeaters. The bank arrays are distributed in a core region of a substrate, and each bank array includes sub-array blocks and includes a plurality of memory cells coupled to a plurality of word-lines and a plurality of bit-lines. Each row decoder is disposed adjacent each bank array in a first direction. Each column decoder is disposed adjacent each bank array in a second direction. The timing control circuit, which is disposed in a peripheral region of the substrate, generates a first control signal to control the word-lines and a second control signal to control the bit-lines in response to operation control signals. Each repeater is disposed adjacent each column decoder and each repeater transfers the first and second control signals to the sub-array blocks in the second direction.

20 Claims, 20 Drawing Sheets

(51) Int. Cl.
  *G11C 5/02* (2006.01)
  *G11C 8/12* (2006.01)
  *G11C 11/4076* (2006.01)
  *G11C 11/408* (2006.01)
  *G11C 11/4091* (2006.01)
  *G11C 11/4094* (2006.01)
  *G11C 29/00* (2006.01)
  *G11C 7/06* (2006.01)
  *G11C 5/06* (2006.01)
  *G11C 11/4074* (2006.01)

(56) References Cited

U.S. PATENT DOCUMENTS

| | | |
|---|---|---|
| 7,221,602 B2 | 5/2007 | Micheloni et al. |
| 7,643,330 B1 | 1/2010 | Lin et al. |
| 8,547,776 B2 | 10/2013 | Suzuki et al. |
| 8,954,674 B2 | 2/2015 | Kim et al. |
| 9,190,164 B1 | 11/2015 | Kim et al. |
| 9,208,856 B2 | 12/2015 | Pelley |
| 2003/0057500 A1* | 3/2003 | Itou ........................ G11C 5/025 |
| | | 257/390 |
| 2009/0024803 A1 | 1/2009 | Kwon et al. |
| 2013/0193507 A1* | 8/2013 | Yoshida .............. G11C 11/4091 |
| | | 257/329 |
| 2013/0322162 A1* | 12/2013 | Lee ........................ G11C 7/12 |
| | | 365/158 |

\* cited by examiner

390

SEMICONDUCTOR MEMORY DEVICES, METHODS OF OPERATION, AND MEMORY SYSTEMS HAVING REDUCED DECODER WIDTH AND CORE SKEW

CROSS-REFERENCE TO RELATED APPLICATION(S)

This application claims the benefit of priority under 35 USC § 119 from Korean Patent Application No. 10-2016-0165463 on Dec. 7, 2016 in the Korean Intellectual Property Office, the contents of which are incorporated by reference herein.

TECHNICAL FIELD

Exemplary embodiments of the inventive concept relate to memory devices, and more particularly to semiconductor memory devices, methods of operating the same and memory systems including the same.

DISCUSSION OF THE RELATED ART

A semiconductor memory device includes a memory cell array, and the memory cell array includes a plurality of memory cells. A row decoder and a column decoder for selecting some of the memory cells are disposed adjacent the memory cell array. Since the row decoder controls word-lines and bit-lines coupled to the memory cells, a width of an area occupied by the row decoder increases and length of wires coupled to the word-lines and the bit-lines also increases.

SUMMARY

Some exemplary embodiments of the inventive concept may provide a semiconductor memory device capable of enhancing performance.

Some exemplary embodiments may provide a method of operating a semiconductor memory device, capable of enhancing performance.

Some exemplary embodiments may provide a memory system including a semiconductor memory device capable of enhancing performance.

According to exemplary embodiments of the inventive concept, a semiconductor memory device includes a memory cell array having a plurality of bank arrays distributed in a core region of a substrate, wherein each of the bank arrays comprises a plurality of sub-array blocks and includes a plurality of memory cells coupled to a plurality of word-lines and a plurality of bit-lines. A plurality of row decoders are each disposed adjacent a respective one of the bank arrays in a first direction of the substrate, and a plurality of column decoders are each disposed adjacent a respective one of the bank arrays in a second direction of the substrate that is substantially perpendicular to the first direction. A timing control circuit is disposed in a peripheral region of the substrate and is configured to generate a first control signal to control the word-lines and a second control signal to control the bit-lines in response to received operational control signals based on a command and an address transmitted from a memory controller, and a plurality of repeaters, each repeater is disposed adjacent a respective one of the column decoders and each of the repeaters is configured to transfer the first control signal and the second control signal from the timing control circuit to the sub-array blocks in the second direction.

According to exemplary embodiments of the inventive concept, A method of operating a semiconductor memory device, wherein the semiconductor memory device comprises a memory cell array including a plurality of bank arrays distributed in a core region of a substrate, and each of the bank arrays comprises a plurality of sub-array blocks disposed in a first direction and a second direction substantially perpendicular to the first direction and includes a plurality of memory cells coupled to a plurality of word-lines and a plurality of bit-lines, includes generating a first control signal to control the word-lines and a second control signal to control the bit-lines in response to receiving operational control signals based on a command and an address; generating a first block selection signal and a second block selection signal to select at least one of the sub-array block, in response receiving to the address; transferring the first control signal and the second control signal to a plurality of switching circuits corresponding to the sub-array blocks along the second direction; transferring the first block selection signal and the second block selection signal to the switching circuits along the first direction; and performing a memory operation based on the first control signal and the second control signal, on a selected sub-array block which is selected in response to the first block selection signal and the second block selection signal.

According to exemplary embodiments of the inventive concept, a memory system includes a semiconductor memory device and a memory controller to control the semiconductor memory device. The semiconductor memory device includes a plurality of bank arrays, a plurality of row decoders, a plurality of column decoders, a timing control circuit and a plurality of repeaters. The plurality of bank arrays are distributed in a core region of a substrate, and each of the bank arrays includes a plurality of sub-array blocks and includes a plurality of memory cells coupled to a plurality of word-lines and a plurality of bit-lines. Each of the row decoders is disposed adjacent to each of the bank arrays in a first direction of the substrate. Each of the column decoders is disposed adjacent to each of the bank arrays in a second direction of the substrate and the second direction is substantially perpendicular to the first direction. The timing control circuit is disposed in a peripheral region of the substrate. The timing control circuit generates a first control signal to control the word-lines and a second control signal to control the bit-lines in response to operation control signals which are based on a command and an address from the memory controller. Each of the repeaters is disposed adjacent to each of the column decoders and each of the repeaters transfers the first control signals and the second controls signals to the sub-array blocks in the second direction.

According to an embodiment of the inventive concept, a semiconductor memory device includes a memory cell array having a plurality of bank arrays distributed in a core region of a substrate, wherein each of the bank arrays comprises a plurality of sub-array blocks and includes a plurality of memory cells coupled to a plurality of word-lines and a plurality of bit-lines; a plurality of row decoders, wherein each of the row decoders is disposed adjacent a respective one of the bank arrays in a first direction of the substrate. A plurality of column decoders, each of which is disposed adjacent a respective one of the bank arrays in a second direction of the substrate that is substantially perpendicular to the first direction. A timing control circuit is configured to generate a first control signal to control the word-lines and a second control signal to control the bit-lines in response to received operational control signals received from an external controller. A bank control circuit that receives the first control signal and the second control signal from the timing circuit and generates a decoding signal in response to receiving a row address and a column address that is output to a first row decoder of the plurality of row decoders. A plurality of repeaters, each being disposed adjacent a respective one of the column decoders and configured to transfer the first control signal and the second control signal received from the bank control circuit to the sub-array blocks in the second direction. The first row decoder provides a first block selection signal and a second block selection signal associated with selection of the sub-array blocks along the first direction.

Accordingly, the semiconductor memory device provides timing control signals to control operation of sub-array blocks along the second direction, provides block selection signals associated with selection of the sub-array blocks along the first direction and the switching circuits in the conjunction regions adjacent to the sub-array blocks control a corresponding sub-array block by combining the timing control signals and the block selection signals. Therefore, core skew may be reduced and effective die area may be increased by reducing a width of a row decoder.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION

Various exemplary embodiments of the inventive concept will be described more fully hereinafter with reference to the accompanying drawings, in which some exemplary embodiments are shown.

Figure 1:
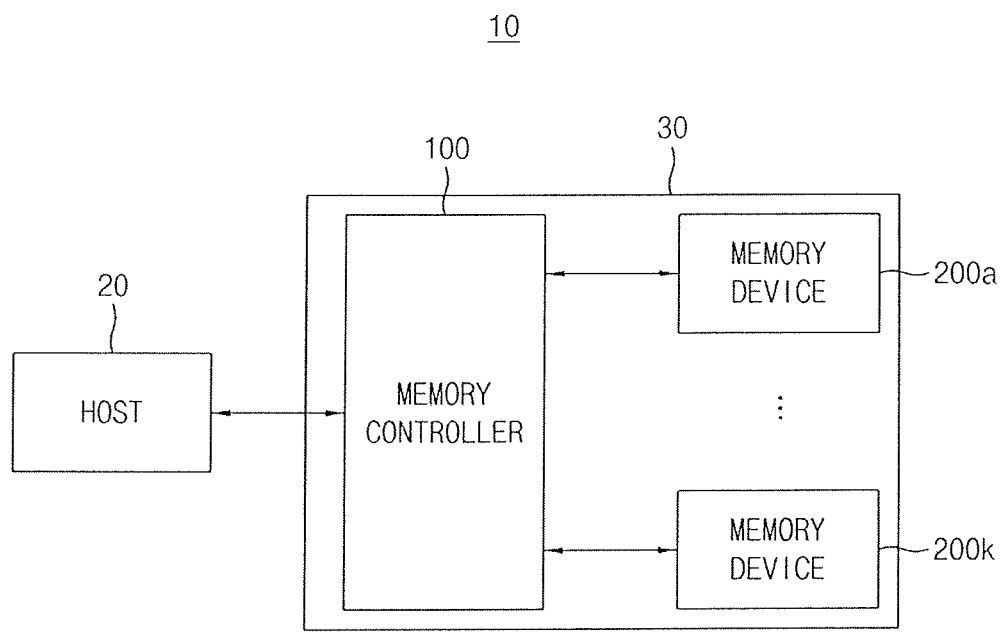
FIG. 1 is a block diagram illustrating an electronic system according to exemplary embodiments.

FIG. 1 is a block diagram illustrating an electronic system according to exemplary embodiments of the inventive concept.

Referring now to FIG. 1, an electronic system 10 may include a host 20 and a memory system 30. The memory system 30 may include, for example, a memory controller 100 and a plurality of semiconductor memory devices 200a~200k (k is a natural number greater than one). The memory system may be arranged, for example within a single semiconductor. There may also be groups of memory devices arranged in respective chips.

The host 20 may communicate with the memory system 30 through various interface protocols such as a Peripheral Component Interconnect-Express (PCI-E), Advanced Technology Attachment (ATA), Serial ATA (SATA), Parallel ATA (PATA), or serial attached SCSI (SAS). In addition, the host 20 may also communicate with the memory system 30 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 30. The memory controller 100 may control an overall data exchange between the host 20 and the plurality of semiconductor memory devices 200a~200k. For example, the memory controller 100 may write data in the plurality of semiconductor memory devices 200a~200k or read data from the plurality of semiconductor memory devices 200a~200k in response to request from the host 20. In addition, in the event of an error condition in one of the memory devices, the memory controller 100 may report the error condition to the host.

In addition, the memory controller 100 may issue operational commands to the plurality of semiconductor memory devices 200a~200k for controlling the plurality of semiconductor memory devices 200a~200k.

In some embodiments of the inventive concept, each of the plurality of semiconductor memory devices 200a~200k may be, for example, a dynamic random access memory (DRAM) including a plurality of dynamic memory cells. In other embodiments, each of the plurality of semiconductor memory devices 200a~200k may be, for example, a memory device including resistive type memory cells such as a magnetoresistive random access memory (MRAM), a resistive random access memory (RRAM), a phase change random access memory (PRAM), or a ferroelectric random access memory (FRAM), etc., just to name some non-limiting possible examples.

Figure 2:
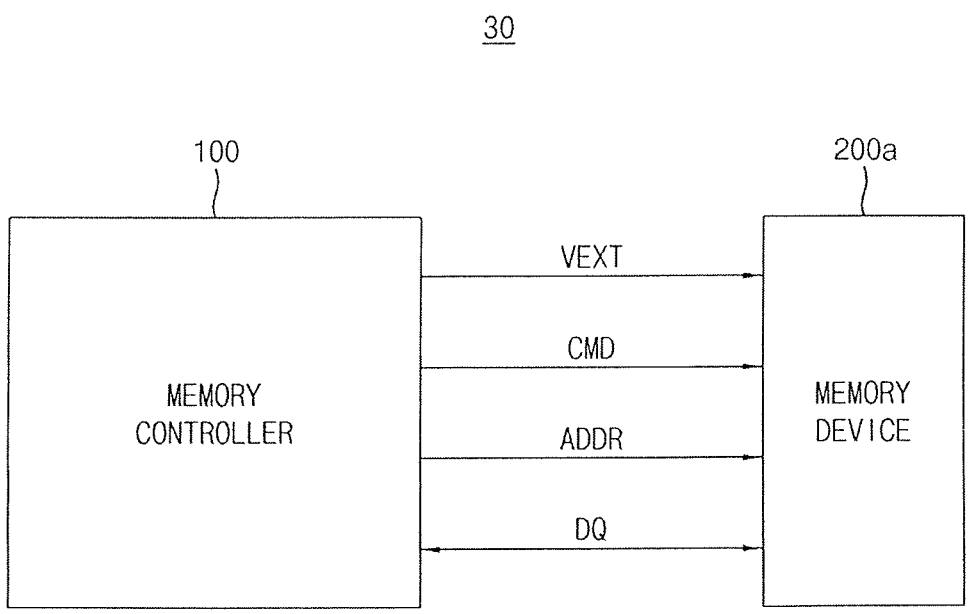
FIG. 2 is a block diagram illustrating an example of the memory system in FIG. 1 according to exemplary embodiments.

FIG. 2 is a block diagram illustrating an example of the memory system in FIG. 1 according to exemplary embodiments of the inventive concept.

In FIG. 2, although only one semiconductor memory device 200a is shown in communication with the memory controller 100, this depiction is provided for ease of illustration. However, the details discussed herein related to semiconductor memory device 200a may equally apply to the other semiconductor memory devices, such as 200b~200k shown in FIG. 1.

Referring to FIG. 2, the memory system 30 may include the memory controller 100 and at least the semiconductor memory device 200a. Each of the memory controller 100 and the semiconductor memory device 200a may be formed as, for example, a separate semiconductor chip or as a separate group of chips (e.g., a semiconductor memory device 200a may include a stack of semiconductor chips in a single semiconductor package). The memory controller 100 may control the semiconductor memory device 200a by transmitting a command CMD and an address ADDR to the semiconductor memory device 200a. The memory controller 100 may transmit data DQ to the semiconductor memory device 200a or receive the data DQ from the semiconductor memory device 200a sent in response to a command from the memory controller 100. In addition, the memory controller 100 may provide an external voltage VEXT to the semiconductor memory device 200a.

Figure 3:
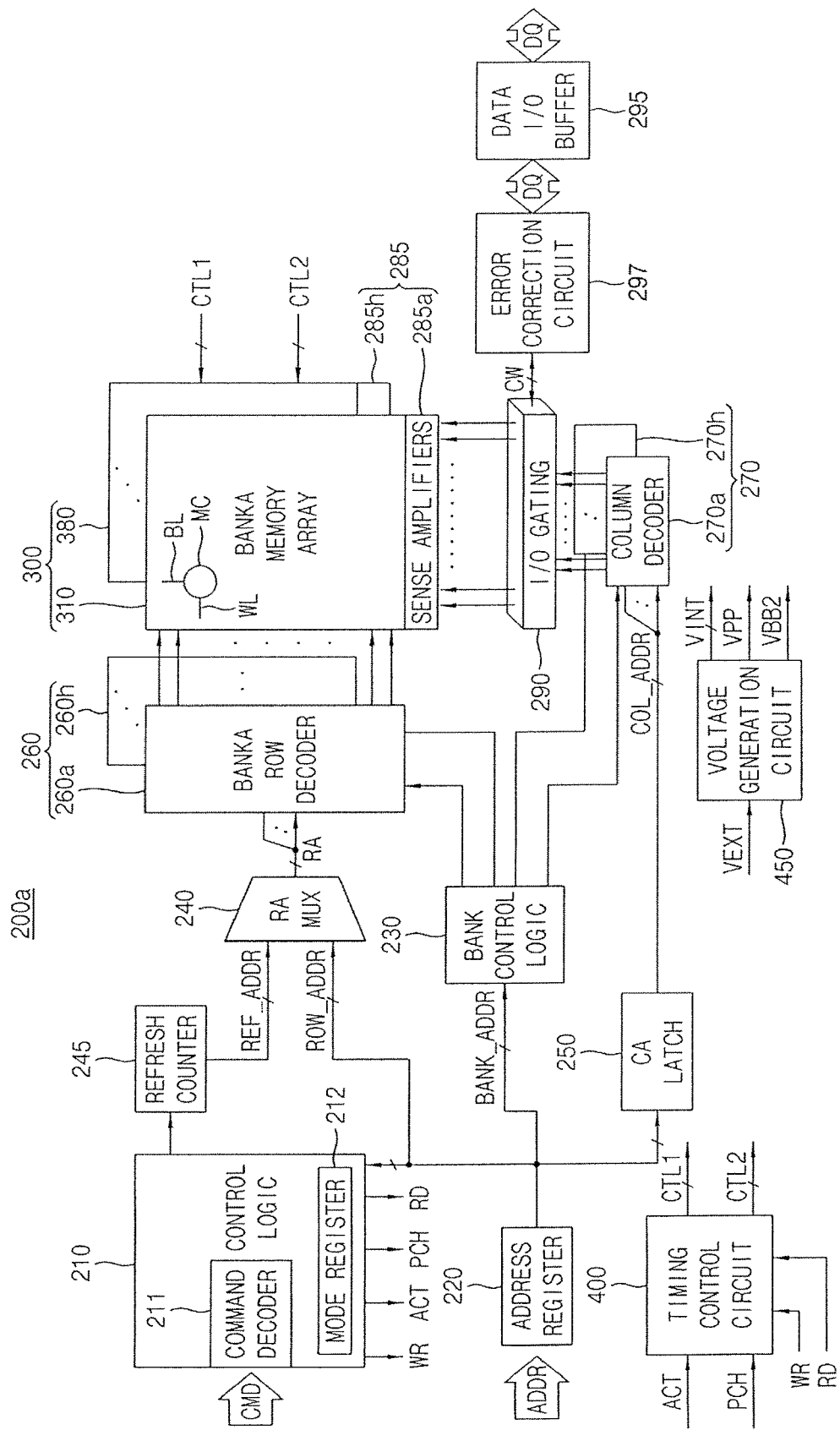
FIG. 3 is a block diagram illustrating the semiconductor memory device in FIG. 2 according to exemplary embodiments.

FIG. 3 is a block diagram illustrating the semiconductor memory device 200a such as shown in FIG. 2 according to exemplary embodiments of the inventive concept.

Referring to FIG. 3, the semiconductor memory device 200a may include a control logic circuit 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, a refresh counter 245, an error correction circuit 297, a timing control circuit 400 and a voltage generation circuit 450. A person of ordinary skill in the art should understand and appreciate that the semiconductor memory device 200a shown in FIG. 3 may have fewer components or more components than shown. When the semiconductor memory device 200a is implemented with a resistive type memory device, the refresh counter 245 is omitted from the semiconductor memory device 200a.

With continued reference to FIG. 3, the memory cell array 300 includes in this example first through eighth bank arrays 310~380. The row decoder 260 includes first through eighth bank row decoders 260a~260h respectively coupled to the first through eighth bank arrays 310~380, the column decoder 270 includes in this example first through eighth bank column decoders 270a~270h respectively coupled to the first through eighth bank arrays 310~380, and the sense amplifier unit 285 includes in this example first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h and first through eighth bank sense amplifiers 285a~285h may collectively form first through eighth banks. Although the semiconductor memory device 200a is illustrated in FIG. 3 as having eight banks, a person of ordinary skill in the art should understand that the semiconductor memory device 200a may include any number of banks (e.g. more than eight banks, or less than eight banks).

The address register 220 receives an address ADDR including a bank address BANK_ADDR, a row address ROW_ADDR and a column address COL_ADDR from the memory controller 100 to identify a particular memory cell in a particular memory cell array. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate, for example, bank control signals in response to the bank address BANK_ADDR that may be output to the bank row decoder 260. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may also be activated in response to the bank control signals.

With continued reference to FIG. 3, the row address multiplexer (RA MUX) 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments of the inventive concept, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the input/output gating circuit 290 to output data corresponding to the decoded column address COL_ADDR.

The I/O gating circuit 290 includes a circuit structure that gates input/output data. The I/O gating circuit 290 may include, for example, read data latches for storing data that is output from the first through eighth bank arrays 310~380, and write drivers for writing data to the first through eighth bank arrays 310~380.

Data DQ to be read from one bank array of the first through eighth memory bank arrays 310~380 may be sensed by a sense amplifier (285a~285h) coupled to the one bank array from which the data is to be read, and may be stored in the read data latches. The data DQ stored in the read data latches of the I/O gating circuit 290 may be an error correction code (ECC) data decoded by the error correction circuit 297, and may be provided to the memory controller 100 via the data I/O buffer 295. Data DQ to be written in one bank array of the first through eighth bank arrays 310~380 may be provided to the data I/O buffer 295 from the memory controller 100 (e.g. FIGS. 1 and 2). The data DQ provided to the data I/O buffer 295 is ECC encoded in the error correction circuit 597 and the write driver may write the data DQ in one bank array of the first through eighth bank arrays 310~380.

In exemplary embodiments of the inventive concept, the error correction circuit 297 may be omitted from the semiconductor memory device 200a.

With continued reference to FIG. 3, the voltage generation circuit 450 receives the external voltage VEXT and generates internal voltages VINT having different levels, a boosted voltage VPP, and a negative voltage VBB2 and provides the internal voltages VINT, the boosted voltage VPP and the negative voltage VBB2 to the memory cell array 300.

The control logic circuit 210 may control operations of the semiconductor memory device 200a. For example, the control logic circuit 210 may generate control signals for the semiconductor memory device 200a to perform a write operation or a read operation. As shown in FIG. 3, the control logic circuit 210 may include a command decoder 211 that decodes a command CMD received from the memory controller 100 and a mode register 212 that sets an operational mode of the semiconductor memory device 200a.

For example, the command decoder 211 may generate operation control signals ACT, PCH, WR, and RD corresponding to the command CMD by decoding a write enable signal (/WE), a row address strobe signal (/RAS), a column address strobe signal (/CAS), and a chip select signal (/CS), etc. The control logic circuit 210 may provide the operation control signals ACT, PCH, WR, and RD to the timing control circuit 400. The operation control signals ACT, PCH, WR, and RD may include an active signal ACT, a pre-charge signal PCH, a write signal WR and a read signal RD.

The timing control circuit 400 (shown in FIG. 3) may generate a first control signal CTL1 to control a voltage level of the word-line WL and a second control signal CTL2 to control a voltage level of the bit-line, in response to the operation control signals ACT, PCH, WR and RD and may provide the first and second control signals CTL1 and CTL2 to the memory cell array 300.

The timing control circuit 400 may provide the first and second control signals CTL1 and CTL2 to the memory cell array 300 along a second direction of the memory cell array 300.

Figure 4:
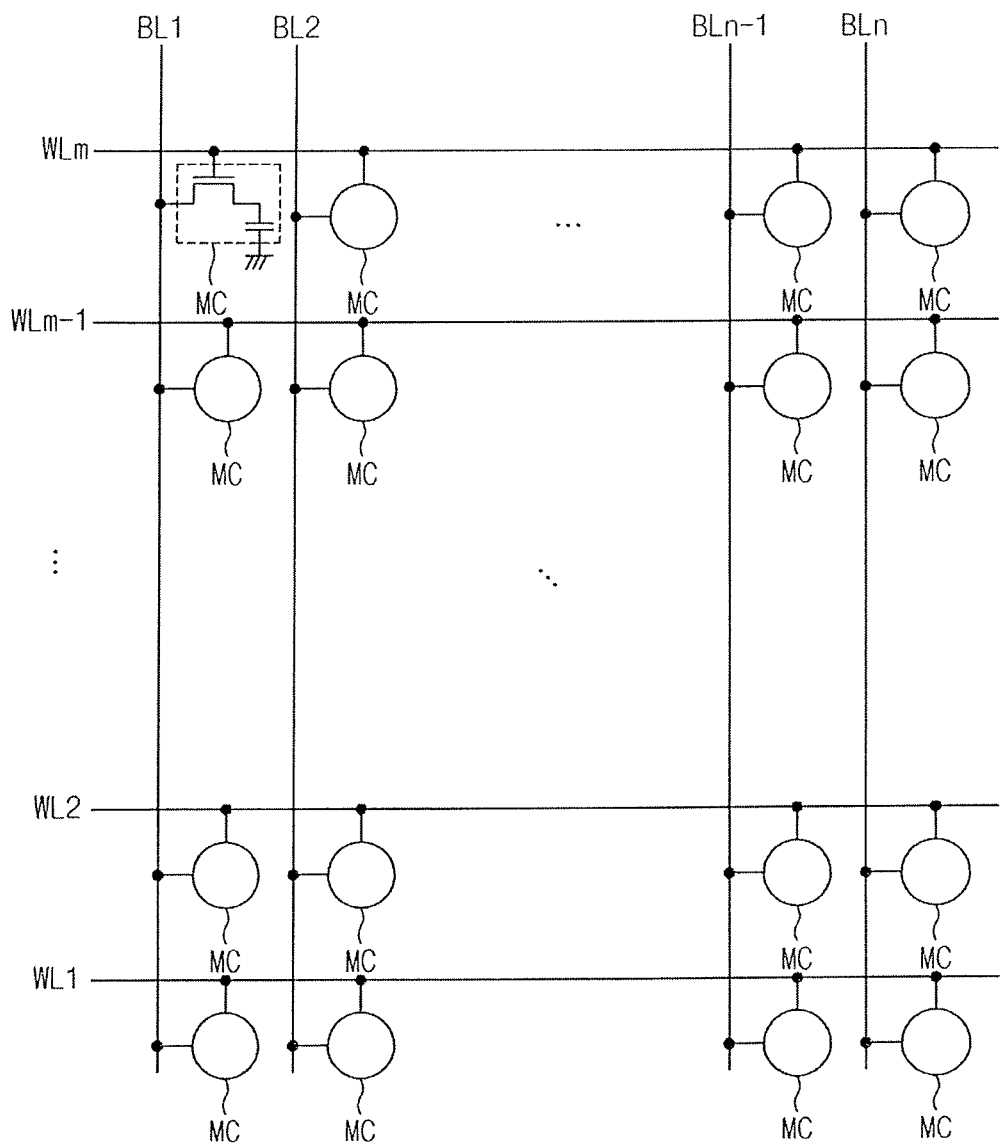
FIG. 4 illustrates an example of the first bank array in the semiconductor memory device of FIG. 3.

FIG. 4 illustrates an example of the structure of the first bank array a semiconductor memory device such as shown in FIG. 3.

Referring to FIG. 4, the first bank array 310 includes a plurality of word-lines WL1~WLm (m is a natural number greater than two) extending in a first direction, a plurality of bit-lines BL1~BLn (n is a natural number greater than two) extending in a second direction substantially orthogonal to the first direction, and a plurality of memory cells MCs disposed adjacent intersections between the word-lines WL1~WLm and the bit-lines BL1~BLn. It can be seen from an example in FIG. 4 that the MC is shown as a transistor in which a word line WLm of the bank array may be connected to the gate, and the bit line BL1 may be connected to the source of the MC.

Figure 5:
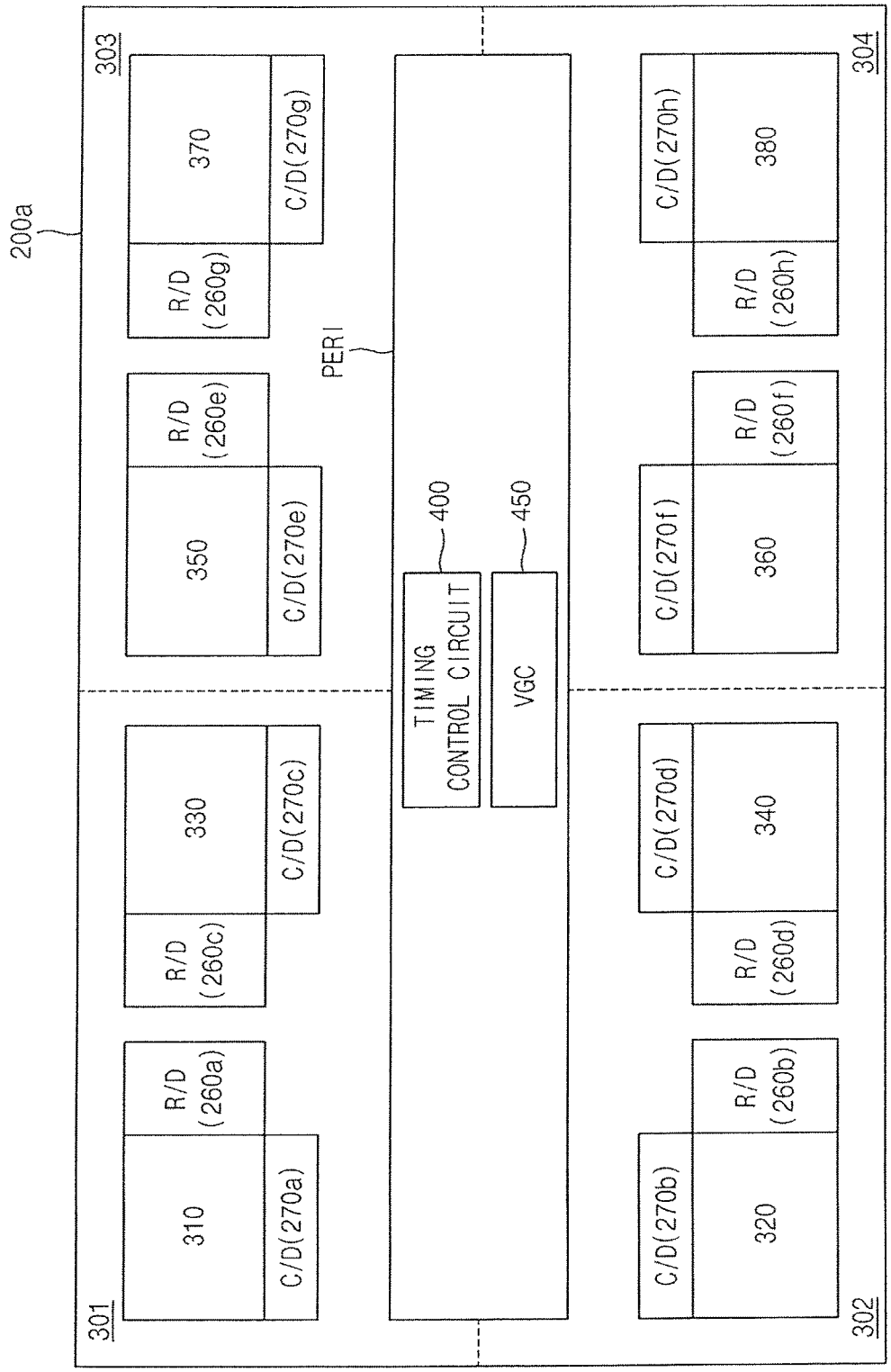
FIG. 5 illustrates an arrangement of the semiconductor memory device of FIG. 3 according to exemplary embodiments of the inventive concept.

FIG. 5 illustrates an arrangement of the semiconductor memory device of FIG. 3 according to exemplary embodiments of the inventive concept.

Referring now to FIG. 5, the semiconductor memory device 200a includes the first through eighth bank arrays 310~380, the first through eighth bank row decoders 260a~260h, the first through eighth bank column decoders 270a~270h, the timing control circuit 400 and the voltage generation circuit 450. According to the inventive concept, the first through eighth bank arrays may be distributed in a core region of the substrate.

The first bank array 310 and the third bank array 330 are arranged in a first region 301 of a substrate (not illustrated), the second bank array 320 and the fourth bank array 340 are arranged in a second region 302 of the substrate, the fifth bank array 350 and the seventh bank array 370 are arranged in a third region 303 of the substrate, and the sixth bank array 360 and the eighth bank array 380 are arranged in a fourth region 304 of the substrate. A person of ordinary skill in the art should understand and appreciate that arrangement illustrated in FIG. 5 is provided for illustrative purposes and the inventive concept is not limited to the structure as shown.

The first bank row decoder 260a and the first bank column decoder 270a are disposed adjacent the first bank array 310, the second bank row decoder 260b and the second bank column decoder 270b are disposed adjacent the second bank array 320, the third bank row decoder 260c and the third bank column decoder 270c are disposed adjacent the third bank array 330, and the eighth bank row decoder 260h and the eighth bank column decoder 270h are disposed adjacent the eighth bank array 380. The first through fourth regions 301~304 may correspond to a core region of the substrate. In addition, the arrangement of the row decoders as shown may provide a structure with reduced decoder width.

The timing control circuit 400 and the voltage generation circuit 450 may be disposed in a central region of the substrate, e.g., a peripheral region PERI of the substrate. The control logic circuit 210, the address register 220, the column address latch 250 and the data I/O buffer 295 may be disposed in the peripheral region PERI of the substrate. The timing control circuit 400, for example, may generate a first control signal that controls the word-lines and a second control signal that controls the bit lines, and the arrangement of the components shown in FIG. 5 may provide for distribution of the control signals in a substantially synchronous manner (e.g. reduced skew).

Figure 6:
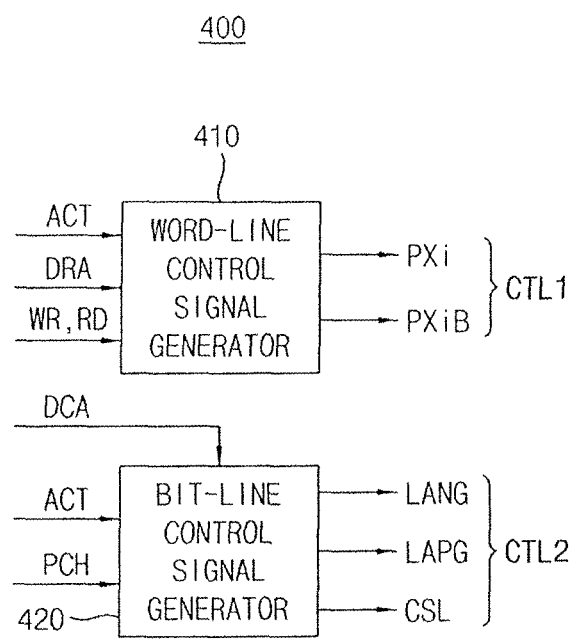
FIG. 6 is a block diagram illustrating an example of the timing control circuit in the semiconductor memory device of FIG. 3 according to exemplary embodiments of the inventive concept.

FIG. 6 is a block diagram illustrating an example of the timing control circuit in the semiconductor memory device of FIG. 3 according to exemplary embodiments of the inventive concept.

Referring to FIG. 6, the timing control circuit 400 may include a word-line control signal generator 410 and a bit-line control signal generator 420.

The word-line control signal generator 410 may generate a first control signal CTL1 including first and second word-line control signals PXi and PXiB to control a word-line based on the operation control signals ACT, WR and RD corresponding to the command CMD a decoded row address DRA. In addition, the word-line control signal generator 410 provides the first and second word-line control signals PXi and PXiB to switching circuits along the second direction. As shown in FIG. 6, the bit-line control signal generator 420 generates second control signals CTL2 including signals LANG, LAPG, and CSL to control voltage levels of a bit-line pair of a selected memory cell, in response to the operation control signals ACT and PCH and the decoded column address DCA and provides the second control signals LANG, LAPG, and CSL to the switching circuits along the second direction.

Figure 7:
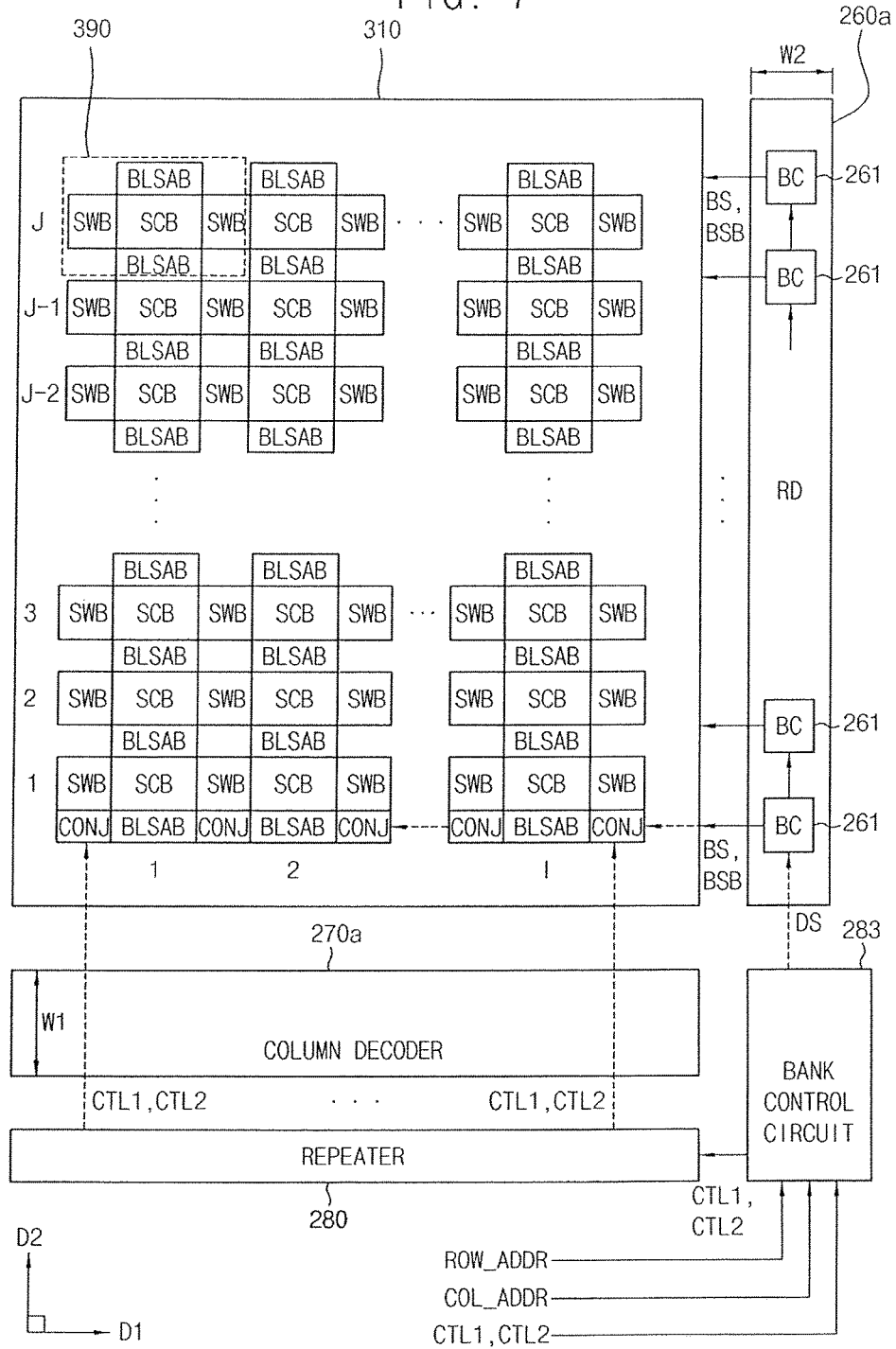
FIG. 7 is exemplary illustration of the architecture of one bank array in the semiconductor memory device of FIG. 3.

FIG. 7 is an exemplary illustration of architecture of one bank array in the semiconductor memory device of FIG. 3.

In FIG. 7, there is shown the first bank array 310 and the first column decoder 270a, the first row decoder 260a, a repeater 280 and a bank control circuit 283 associated with the first bank array 310 are illustrated. The repeater 280 is disposed adjacent the column decoder 270a.

Referring to FIG. 7, in the first bank array 310, I sub-array blocks SCB may be disposed in a first direction D1, and J sub-array blocks SCB may be disposed in a second direction D2 substantially perpendicular to the first direction D1. A plurality of bit-lines, a plurality of word-lines, and a plurality of memory cells may be disposed in each of the sub-array blocks SCB. In addition, the plurality of memory cells may be disposed at intersections between the bit-lines and the word-lines, such as shown, for example, in FIG. 4. I+1 sub word-line driver regions SWB may be disposed between the sub-array blocks SCB in the first direction D1. Sub word-line drivers may be disposed in the sub word-line driver regions SWB. J+1 bit-line sense amplifier regions BLSAB may be disposed, for example between the sub-array blocks SCB in the second direction D2. Bit-line sense amplifiers to sense data stored in the memory cells may be disposed in the bit-line sense amplifier regions BLSAB.

A plurality of conjunction regions CONJ (e.g. shown as "CON" in FIG. 7) may be disposed adjacent the sub word-line driver regions SWB and the bit-line sense amplifier regions BLSAB. A switch circuit is disposed in each of the conjunction regions CONJ.

With continued reference to FIG. 7, the bank control circuit 283 receives the row address ROW_ADDR, the column address COL_ADDR, the first control signal CTL1 and the second control signal CTL2, generates a decoding signal DS in response to the row address ROW_ADDR that is provided to the first row decoder 260a and the column address COL_ADDR that is provided to the first column decoder 270a, and provides the decoding signal DS to the block coding circuits 261 shown in the first row decoder 260a. The bank control circuit 283 provides the first control signal CTL1 and the second control signal CTL2 which are received from the timing control circuit 400 to the repeater 280.

The block coding circuits 261 are included in the first row decoder 260a and arranged in the second direction D2 such that each of the block coding circuits 261 corresponds to a row of sub-array blocks SCB. Each one of the block coding circuits 261 may correspond to a respective row of the sub-array blocks SCB in the first direction D1. Each of the block coding circuits 261 transfers a first block selection signal BS and a second block selection signal BCSB to switching circuits in the conjunction regions CONJ in the first direction D1 to select at least one of the sub-array blocks SCB. While FIG. 7 shows a one-to-one correspondence, e.g. one blocking coding circuit for each row of the sub-array blocks SCB, a person of ordinary skill in the art understands and appreciates that the inventive concept is not limited to the arrangement shown and described.

The repeater 280 receives the first control signal CTL1 and the second control signal CTL2 from the bank control circuit 283 and transfers the first control signal CTL1 and the second control signal CTL2 to the switching circuits in the conjunction regions CONJ in the second direction D2 to control the bit-lines and the word-lines. The repeater 280 transfers the first control signal CTL1 and the second control signal CTL2 to the switching circuits in the conjunction regions through a signal line formed, for example, in a fourth metal layer of the semiconductor memory device 200a.

The first column decoder 270a, as shown in FIG. 7, may have a first width W1 in the second direction D2, whereas the first row decoder 260a may have a second width W2 in the first direction D1. The first width W1 of the first column decoder 270a may be greater than the second width W2 of the first row decoder 260a.

In a conventional semiconductor memory device, a row decoder arranged adjacent a memory bank array has a construction such that the first control signal CTL1 and the second control signal CTL2 are output to the sub-array blocks SCB along the first direction D1. Therefore, a width of such a row decoder is increased in the first direction to accommodate the receipt and output of control signals in addition to the inclusion of, for example, block coding circuits. The structure of such a row decoder increases an occupied area by the semiconductor, which may result in the effective die area of the semiconductor being decreased.

According to exemplary embodiments of the inventive concept, the semiconductor memory device 200a has a structure in which the repeater 280 provides the first control signal CTL1 and the second control signal CTL2 associated with operating timing of the sub-array blocks SCB along the second direction D2. In addition, the first row decoder 260a provides the first block selection signal BS and the second block selection signal BSB associated with selection of the sub-array blocks SCB along the first direction D1 and the switching circuits, (such as in the conjunction region CONJ), to control a corresponding sub-array block SCB by combining the first control signal CTL1 and the second control signal CTL2 and the first block selection signal BS and the second block selection signal BSB. The reduced width of the first row decoder 260a may lessen a timing difference between signals provided in a column direction versus signals provided in a row direction. Therefore, a core skew (e.g. timing skew) that occurs due to transfer differences between the timing control signal and the block selection signal may be reduced.

In addition, with the reduction in the occupied area of the semiconductor device because the structure of the row decoder according to the inventive concept is less wide than a row decoder in which, for example, the control signals CTL1 and CTL2 were received and output to the sub-arrays of SCBs, a person of ordinary skill in the art understands and appreciates that it follows that an increase in the effective die area of the semiconductor may result from the reduction in the occupied area.

In addition, the bank control circuit 283 shown in FIG. 7 may be included in the bank control logic 230 in FIG. 3.

Figure 8:
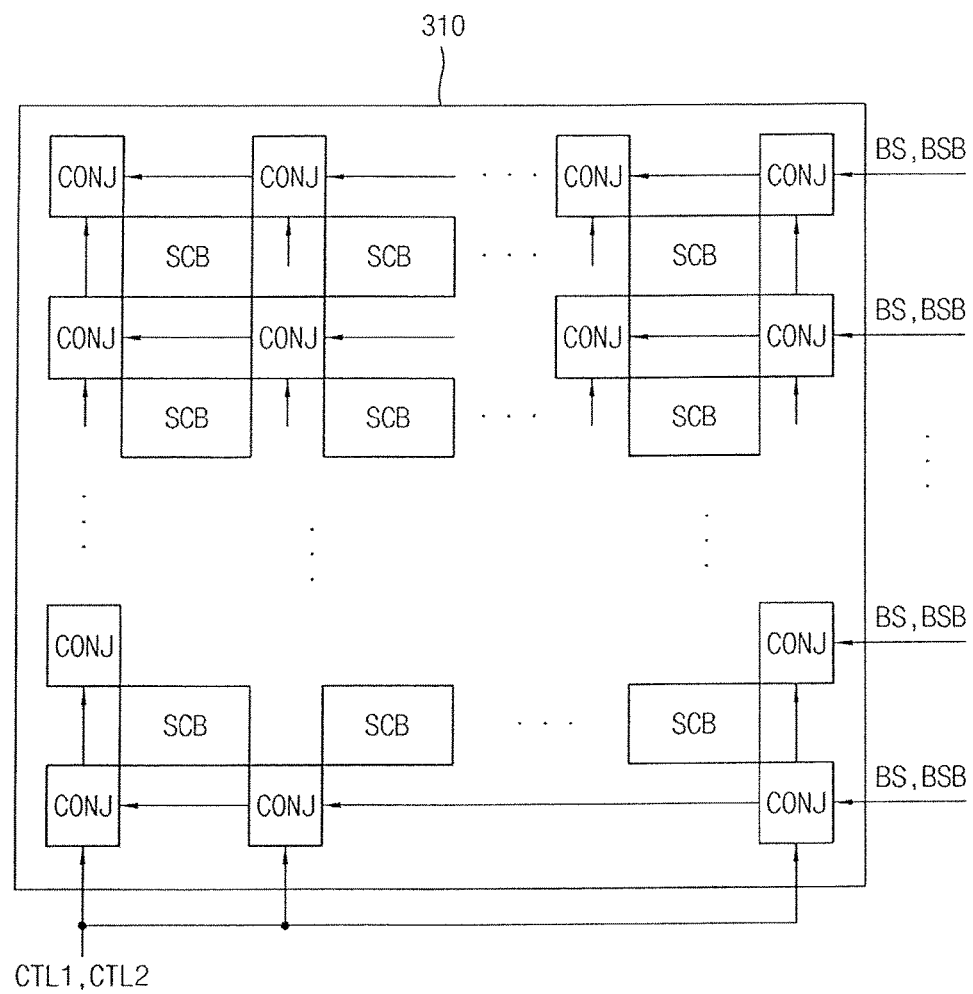
FIG. 8 illustrates arrangement of the sub-array blocks and the conjunction regions in the first bank array in FIG. 7.
Figure 8:
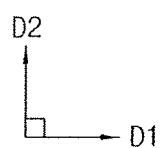

FIG. 8 illustrates an arrangement of the sub-array blocks and the conjunction regions in the first bank array in FIG. 7.

Referring to FIGS. 7 and 8, the plurality of conjunction regions CONJ are arranged adjacent the sub word-line driver regions SWB and the bit-line sense amplifier regions BLSAB. Each of the switching circuits is arranged in each of the conjunction regions CONJ. The first control signal CTL1 and the second control signal CTL2 associated with operating timing of the sub-array blocks SCB are provided, for example, by the repeaters, to the switching circuits in the conjunction regions CONJ along the second direction D2 and the first block selection signal BS and the second block selection signal BSB associated with selection of the sub-array blocks SCB are provided to switching circuits in the conjunction regions CONJ the along the first direction D1. The first block selection signal BS and the second block selection signal BSB may have different logic levels with respect to each other.

Figure 9:
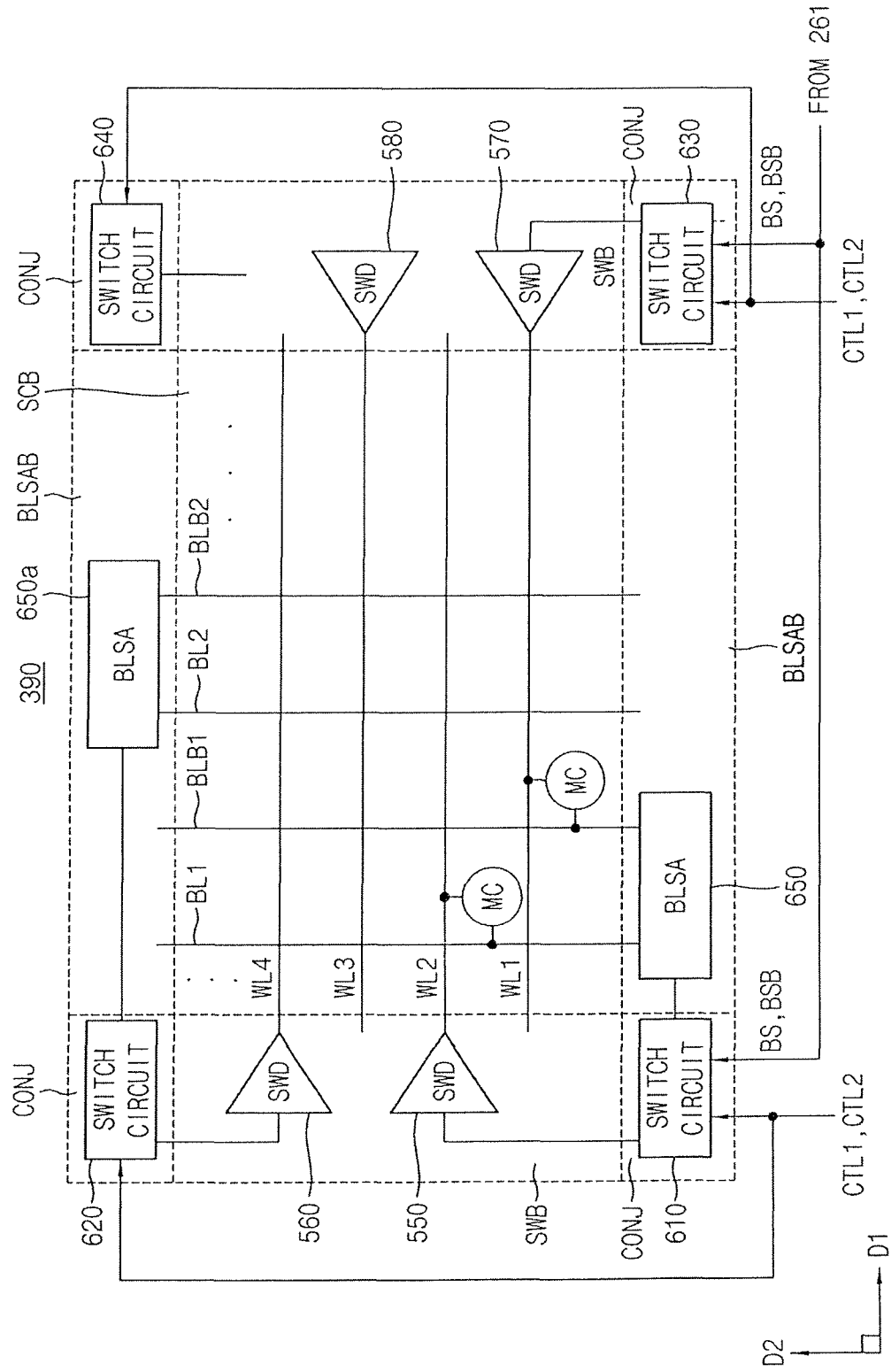
FIG. 9 illustrates a portion of the first bank array in FIG. 7 according to exemplary embodiments of the inventive concept.

FIG. 9 illustrates a portion of the first bank array in FIG. 7 according to exemplary embodiments of the inventive concept.

Referring to FIGS. 7 to 10, in a portion 390 (FIG. 9) of the first bank array 310, the sub-array block SCB, the bit-line sense amplifier regions BLSAB, the sub word-line driver regions SWB and the conjunction regions CONJ are disposed.

The sub-array block SCB includes a plurality of word-lines WL1~WL4 extending in a row direction (the first direction D1) and a plurality of bit-line pairs BL1~BL2 and BLB1~BLB2 extending in a column direction (the second direction D2). The sub-array block SCB includes a plurality of memory cells MCs disposed at intersections between the word-lines WL1~WL4 and the bit-line pairs BL1~BL2 and BLB1~BLB2.

With continued reference to FIG. 9, the sub word-line driver regions SWB include a plurality of sub word-line drivers 550, 560, 570 and 580 that respectively drive the word-lines WL1~WL4. The sub word-line drivers 550 and 560 may be disposed in the sub word-line driver region SWB, which is leftward (in this example), with respect to the sub-array block SCB. In addition, the sub word-line drivers 570 and 580 may be disposed in the sub word-line driver region SWB, which is rightward (in this example), with respect to the sub-array block SCB.

The bit-line sense amplifier regions BLSAB include bit-line sense amplifiers BLSA 650 and 650a coupled to the bit-line pairs BL1~BL2 and BLB1~BLB2. The bit-line sense amplifier 650 may sense and amplify a voltage difference between the bit-line pair BL and BLB to provide the amplified voltage difference to a local input/output line pair.

As illustrated in FIG. 9, the bit-line sense amplifiers 650 and 650a may be alternately disposed at upper portion and a lower portion of the sub-array block SCB. The conjunction regions CONJ are disposed adjacent to the bit-line sense amplifier regions BLSAB, the sub word-line driver regions SWB and the sub-array block SCB. A plurality of switching circuits 610, 620, 630 and 640 may be disposed in the conjunction regions CONJ.

The switching circuit 610 may selectively provide the first control signal CTL1 and the second control signal CTL to the sub word-line driver 550 and the bit-line sense amplifier 650, respectively, in response to receiving the first and second block selection signals BS and BSB. In a similar arrangement, the switching circuit 620 may selectively provide the first control signal CTL1 and the second control signal CTL to the sub word-line driver 560 and the bit-line sense amplifier 650a, respectively, in response to the first and second block selection signals BS and BSB. Each of the switching circuits 630 and 640 may perform similar operation.

Figure 10:
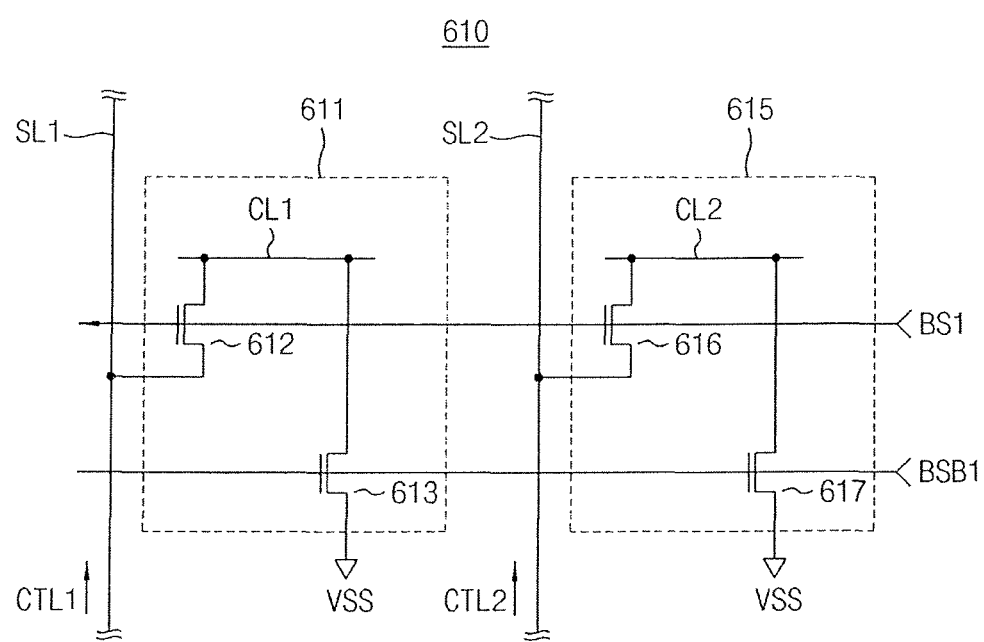
FIG. 10 is a circuit diagram illustrating one of the switching circuits in FIG. 9 according to exemplary embodiments of the inventive concept.

FIG. 10 is a circuit diagram illustrating a switching circuit (e.g. CONJ) in FIG. 9 according to exemplary embodiments of the inventive concept.

In FIG. 10, a configuration of the switching circuit 610 is illustrated for example, each of the switching circuits 620, 630 and 640 may have a substantially similar configuration as the switching circuit 610.

Referring to FIG. 10, the switching circuit 610 includes a first switch 611 and a second switch 615.

The first switch 611 includes a first transistor 612 and a second transistor 613, and the second switch 615 includes a third transistor 616 and a fourth transistor 617.

The first transistor 612 includes a first electrode coupled to the sub word-line driver 550 through a connection line CL1, a second electrode receiving the first control signal CTL1 through a first signal line SL1 and a gate electrode receiving the first block selection signal BS1. The second transistor 613 includes a first electrode coupled to the sub word-line driver 550 through the connection line CL1 in parallel with the first transistor 612, a second electrode coupled to a ground voltage VSS and a gate electrode receiving the second block selection signal BSB1.

The third transistor 616 includes a first electrode coupled to the bit-line sense amplifier 650 through a connection line CL2, a second electrode receiving the second control signal CTL2 through a second signal line SL2 and a gate electrode receiving the first block selection signal BS1. The fourth transistor 617 includes a first electrode coupled to the bit-line sense amplifier 650 through the connection line CL2 in parallel with the third transistor 616, a second electrode coupled to the ground voltage VSS and a gate electrode receiving the second block selection signal BSB1.

When the first block selection signal BS1 has a first logic level (e.g., a logic high level) and the second block selection signal BSB1 has a second logic level (e.g., a logic low level), the first control signal CTL1 is provided to the sub word-line driver 550 through the first transistor 612 and the second control signal CTL2 is provided to the bit-line sense amplifier 650 through the third transistor 616. A memory operation is performed on memory cells connected to the sub word-line driver 550 and the bit-line sense amplifier 650.

When the first block selection signal BS1 has a second logic level and the second block selection signal BSB1 has a first logic level, the ground voltage VSS is provided to the sub word-line driver 550 through the second transistor 613 and the ground voltage VSS is provided to the bit-line sense amplifier 650 through the fourth transistor 617. Therefore, the memory cells associated with the sub word-line driver 550 and the bit-line sense amplifier 650 are unselected.

Figure 11:
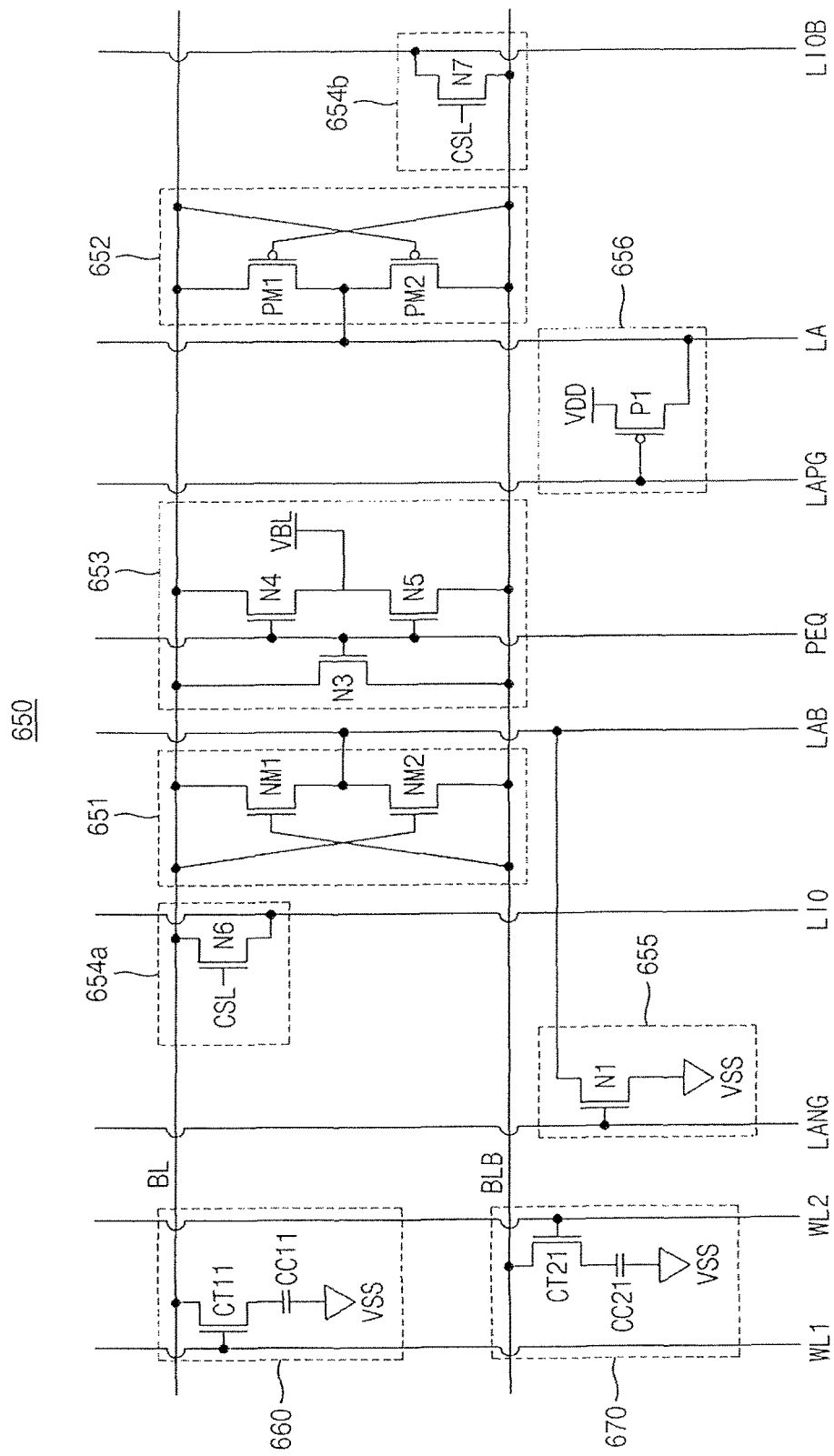
FIG. 11 is a circuit diagram illustrating the bit-line sense amplifier in FIG. 9 according to exemplary embodiments of the inventive concept.

FIG. 11 is a circuit diagram illustrating the bit-line sense amplifier in FIG. 9 according to exemplary embodiments of the inventive concept.

Referring to FIG. 11, the bit-line sense amplifier 650 is coupled to bit-lines BL and BLB of each of memory cells 660 and 670 in the memory cell array 300.

The bit-line sense amplifier 650 shown in FIG. 11 includes an N-type sense amplifier 651, a P-type sense amplifier 652, a pre-charge circuit 653, column select switches 654a and 654b, an NSA driver 655, and a PSA driver 656.

The N-type sense amplifier 651 discharges a low-level bit-line of the bit-lines (or, bit-line pair) BL and BLB to a low level during a sensing operation. The N-type sense amplifier 651 includes two n-channel metal oxide semiconductor (NMOS) transistors NM1 and NM2. A gate of the NMOS transistor NM1 is connected to the bit-line (second bit-line) BLB, and a drain of the NMOS transistor NM1 is connected to the bit-line (first bit-line) BL, and a source of the NMOS transistor NM1 is connected to a sense enable line LAB. The NMOS transistor NM2 has a gate connected to the bit-line BL, a drain connected to the sense enable line LAB, and a source connected to the bit-line BLB The N-type sense amplifier 651 connects a low-level bit-line to the sense enable line LAB. The sense enable line LAB is connected to the ground voltage VSS. The low-level bit line is one of the bit lines BL and BLB according to data stored in a selected memory cell 660 or 670.

An operation is described under assumption that data stored in a memory cell 660 storing a logic state "1" is sensed. First, the bit-lines BL and BLB are pre-charged and equalized to the pre-charge voltage VDD/2 by a pre-charge circuit 653. A cell transistor CT11 is turned on when a word-line WL1 is activated to select the memory cell 660. At this time, the charges stored in a cell capacitor CC11 are shared with the bit-line BL. A voltage of the bit-line BL is higher than the pre-charge voltage VDD/2 by the charge sharing, and the bit-line BLB maintains the half voltage VDD/2.

The P-type sense amplifier 652 charges a high-voltage bit-line of the bit-lines BL and BLB with a power supply voltage VDD level at a sensing operation. The P-type sense amplifier 652 includes two p-channel metal oxide semiconductor (PMOS) transistors PM1 and PM2. The PMOS transistor PM1 has a gate connected to the bit-line BLB, a source connected to the bit-line BL, and a drain connected to a sense enable line LA. The PMOS transistor PM2 has a gate connected to the bit-line BL, a source connected to sense enable line LA, and a drain connected to the bit-line BLB The P-type sense amplifier 652 charges a high-voltage bit-line of the bit-lines BL and BLB with a power supply voltage VDD provided to the sense enable line LA. When data stored in the memory cell 660 storing logic state "1" is sensed, the bit-lines BL and BLB are pre-charged and equalized to the pre-charge voltage VDD/2 by the pre-charge circuit 653. The cell transistor CT11 is turned on when the word-line WL1 is activated to select the memory cell 660. At this time, charges stored in a cell capacitor CC11 are shared with the bit-line BL. A voltage of the bit-line BL is higher than the pre-charge voltage VDD/2 by the charge sharing, and the bit-line BLB maintains the half voltage VDD/2.

The PSA driver 656 provides a charging voltage VDD to the sense enable line LA. Therefore, the transistor PM2 is turned off because the gate of the transistor PM2 is coupled to the bit-line with a voltage increased by the charge sharing. On the other hand, the transistor PM1 is turned on because the gate of the transistor PM1 is coupled to the bit-line BLB that is provided with the ground voltage VSS. The voltage of the bit-line BL goes to the power supply voltage VDD level which is provided to the sense enable line LA.

The pre-charge circuit 653 pre-charges the bit-lines BL and BLB with a half voltage VDD/2 in response to a control signal PEQ in sensing operation. When the control signal PEQ is activated, the pre-charge circuit 653 supplies a bit-line pre-charge voltage VBL to the bit-lines BL and BLB. The bit-line pre-charge voltage VBL may be a half voltage VDD/2. The bit-lines BL and BLB are connected such that their voltages are equalized. If the bit-lines BL and BLB are charged by the pre-charge level VBL, the control signal PEQ is inactivated. The pre-charge circuit 653 includes NMOS transistors N3, N4 and N5.

With continued reference to FIG. 11, the column select switches 654a and 654b connect data sensed by the N-type and P-type sense amplifiers 651 and 652 to input/output lines LIO and LIOB in response to a column selection signal CSL. The column select switches 654a and 654b are turned on such that the sensed data is transferred to the input/output lines LIO and LIOB. For example, in a read operation when sensing levels of the N-type and P-type sense amplifiers 651 and 652 are stabilized, a column selection signal CSL is activated. Then the column select switches 654a and 654b are turned on such that the sensed data is transferred to the input/output lines LIO and LIOB. Voltages of the bit-lines BL and BLB are varied when charges of bit-lines BL and BLB are shared with the input/output lines LIO and LIOB. The column select switches 654a and 654b includes NMOS transistors N6 and N7.

The NSA driver 655 provides a driving signal to the sense enable line LAB of the N-type sense amplifier 651. The NSA driver 655 receives control signals LANG and PBSG from the bit-line control signal generator 420 (FIG. 6). Based on the control signals LANG and PBSG, the NSA driver 655 grounds the sense enable line LAB. The NSA driver 655 includes the ground transistor N1 to control a voltage of the sense enable line LAB.

The PSA driver 656 provides the charge voltage VDD to the sense enable line LA of the P-type sense amplifier 652. The PSA driver 656 is controlled by the control signal LAPG from the bit-line control signal generator 420. The control signals LAPG and LANG are complementary to each other.

Figure 12:
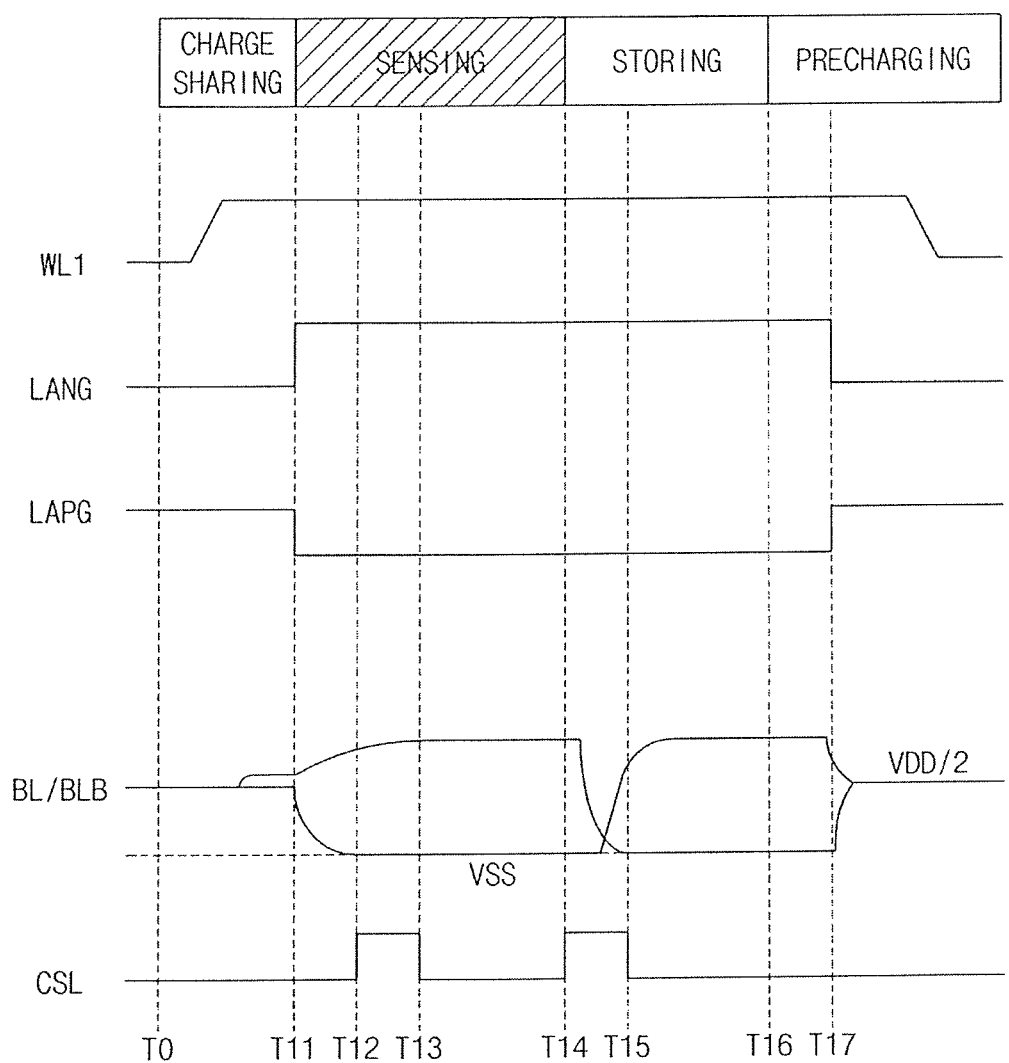
FIG. 12 is a timing diagram illustrating an operation of the bit-line sense amplifier in FIG. 11.

FIG. 12 is a timing diagram illustrating an operation of the bit-line sense amplifier in FIG. 11.

Referring now to FIGS. 11 and 12, at T0, a word-line WL1 is activated to access a selected memory cell (for example, the memory cell 660 in FIG. 11). A voltage of the bit-line BL increases by the charge sharing and a voltage of the bit-line is maintained at the pre-charge voltage VDD/2 during an time interval between T0 and T11. The control signal LANG is maintained at a high level and the control signal LAPG is maintained at a low level during an time interval between T11 and T17. Therefore, a voltage of the bit-line BL is maintained at a charge voltage VDD and the voltage of the bit-line BLB is maintained at the ground voltage VSS.

The column selection signal CSL is activated for data output between T12 and T13. Between T14 and T15, a write command is applied to the same bank activated by the active signal ACT of the read command. According to the write command, a column selection signal CSL is activated and input data is transferred to bit-lines BL and BLB from data input/output lines LIO and LIOB. At this time, the high-level bit-line is discharged toward a low level, and the low-level bit-line is charged toward a high level. Input data is stored in a selected memory cell by the N-type and P-type sense amplifiers 651 and 652. At T6, the pre-charge signal PCH is activated according to a pre-charge command. A pre-charge operation on bit-lines is performed. The bit-lines developed to different voltage levels are pre-charged to a pre-charge voltage VDD/2 at T17.

Figure 13:
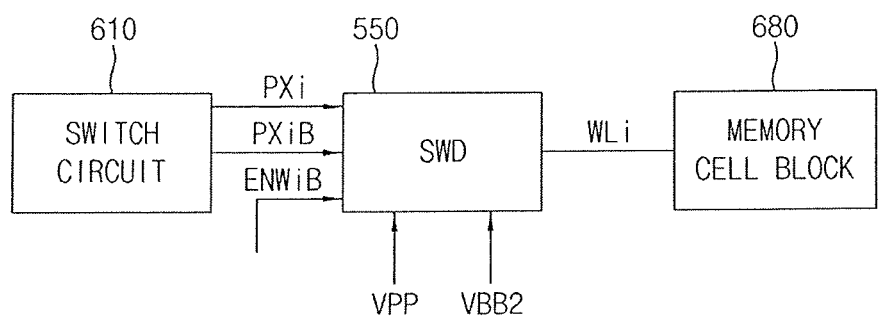
FIG. 13 illustrates the portion of the first bank array of FIG. 9.

FIG. 13 illustrates the portion of the first bank array of FIG. 9 according to an embodiment of the inventive concept.

Referring to FIG. 13, the sub word-line driver 550 is provided with the boosted voltage VPP from the voltage generation circuit 450, and may be provided with negative voltage VBB2 from the voltage generation circuit 450. In addition, the switching circuit 610 provides the first and second word-line control signals PXi and PXiB to the sub word-line driver 550. The sub word-line driver 550 enables a word-line WLi coupled to a memory cell block 680 with the boosted voltage VPP or disables the word-line WLi with the negative voltage VBB2 in response to the first and second word-line control signals PXi and PXiB and a word-line enable signal ENWiB. The sub word-line driver 550 may control a voltage level of the word-line WLi.

Figure 14:
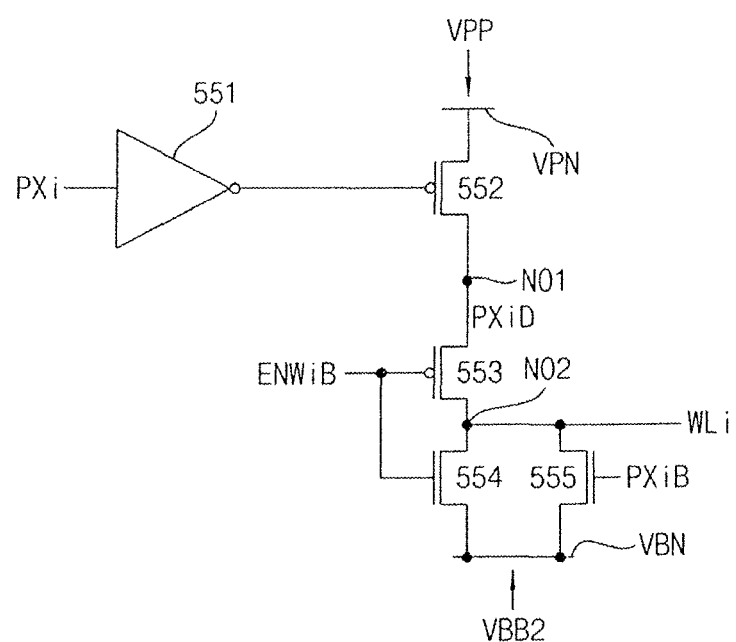
FIG. 14 is a circuit diagram illustrating an example of the sub word-line driver in FIG. 13 according to exemplary embodiments.

FIG. 14 is a circuit diagram illustrating an example of the sub word-line driver in FIG. 13 according to exemplary embodiments.

Referring to FIG. 14, the sub word-line driver 550 includes an inverter 551, PMOS transistors 552 and 553, and NMOS transistors 554 and 555. The inverter 551 inverts the first word-line control signal PXi and is coupled to a gate of the PMOS transistor 552. The PMOS transistor 552 has a source connected to a boosted voltage terminal VPN, a gate receiving an output of the inverter 551 and a drain connected to a boosted node NO1. The PMOS transistor 553 has a source connected to the boosted node NO1, a gate receiving word-line enable signal ENWiB and a drain connected to an enable node NO2. The NMOS transistor 554 has a drain connected to the enable node NO2, a gate receiving the word-line enable signal ENWiB and a source connected to a negative voltage terminal VBN. The NMOS transistor 555 has a drain connected to the enable node NO2, a gate receiving the second word-line enable control signal PXiB and a source connected to the negative voltage terminal VBN. The boosted voltage VPP is applied to the boosted voltage terminal VPN and the negative voltage VBB2 is applied to the negative voltage terminal VBN.

The PMOS transistor 552 receives the boosted voltage VPP, and transfers the boosted voltage to the boost node NO1 in response to the first word-line enable control signal PXi. The PMOS transistor 553 receives the boosted voltage from the PMOS transistor 552 through a source and enables a corresponding word line WLi connected to the enable node NO2 with the boosted voltage in response to the word-line enable signal ENWiB. The NMOS transistor 554 transfers the negative voltage VBB2 to the enable node NO2 in response to the word-line enable signal ENWiB and the NMOS transistor 555 and the NMOS transistor 555 disables the corresponding word-line WLi connected to the enable node NO2 with the negative voltage in response to the second word-line enable control signal PXiB.

Figure 15:
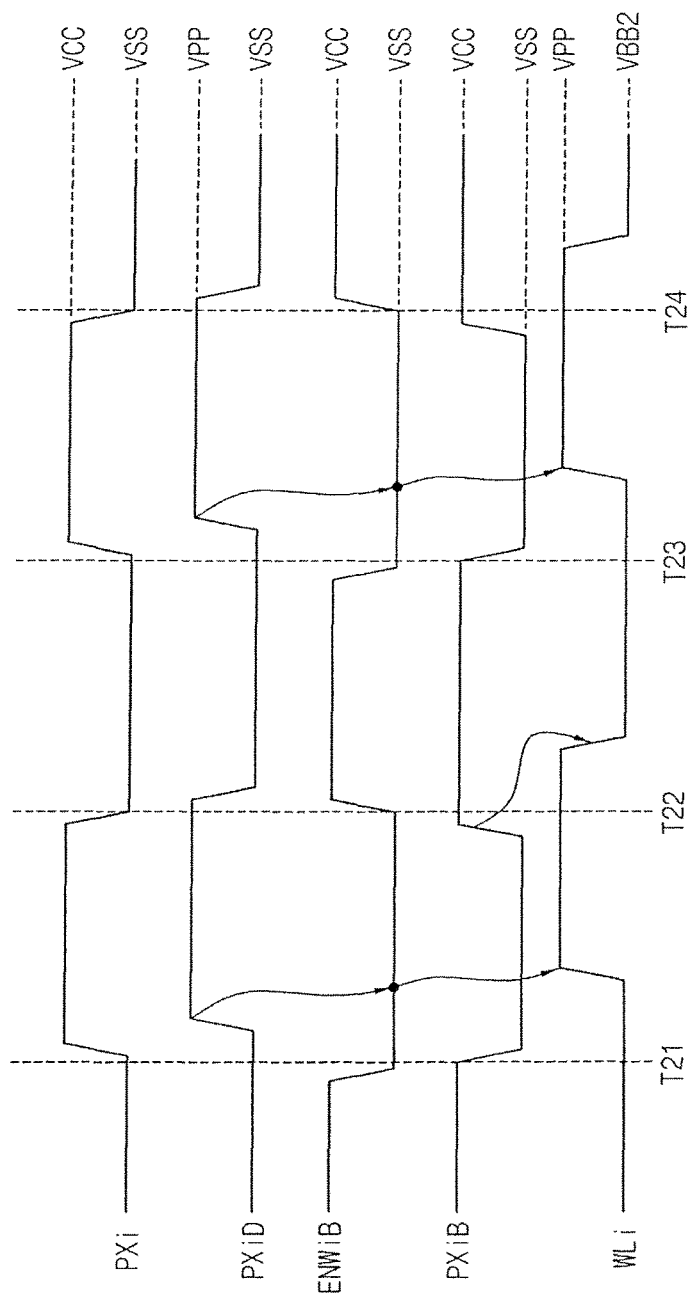
FIG. 15 is a timing diagram illustrating an operation of the word-line in FIG. 14.

FIG. 15 is a timing diagram illustrating an operation of the word-line in FIG. 14.

Referring to FIGS. 13 through 15, the first word-line enable control signal PXi is logic low level initially, transits to logic high level VCC at each timing T21 and T23 when the corresponding word-line is to be enabled in response to a row address and transits to logic low level VSS at each timing T22 and T24 when other word-lines are enabled.

A boosted node voltage signal PXiD is logic low level initially, transitions to the boosted voltage VPP at each timing T21 and T23 when first word-line enable control signal PXi transitions to logic high VCC and transitions to the ground voltage at each timing T22 and T24 when first word-line control signal PXi transitions to logic low VSS level.

After a corresponding word-line WLi is disabled while the word line enable signal ENWiB is initially maintained at the logic high VCC level, the word line enable signal ENWiB transits to the logic low level VSS at each timing T21 and T23 when the row decoder activates the corresponding word line WLi, and transits to logic low level VSS at each timing T22 and T24 when other word-lines are enabled.

After the corresponding word-line WL is disabled to the ground voltage while the second word-line control signal PXiB is initially maintained at the high level, the word-line control signal PXiB transits to the low level at each timing T21 and T23 the corresponding word line WLi is enabled. When other word-lines are enabled, the second word-line control signal PXiB re-transits to the high level VCC at each timing T22 and T24.

The corresponding word-line WLi is initially maintained at the negative voltage level in response to the second word-line control signal PXiB, and the boost node voltage signal PXiD is delayed for a given time and transferred when the word-line enable signal ENWiB transits to the logic low level at each timing T21 and T23. When other word-lines are activated and the word-line enable bar signal ENWiB transits to the logic high level at each timing T22 and T24, the corresponding word-line signal WL is disabled to the negative voltage VBB2 in response to the second word-line control signal PXiB.

Figure 16A:
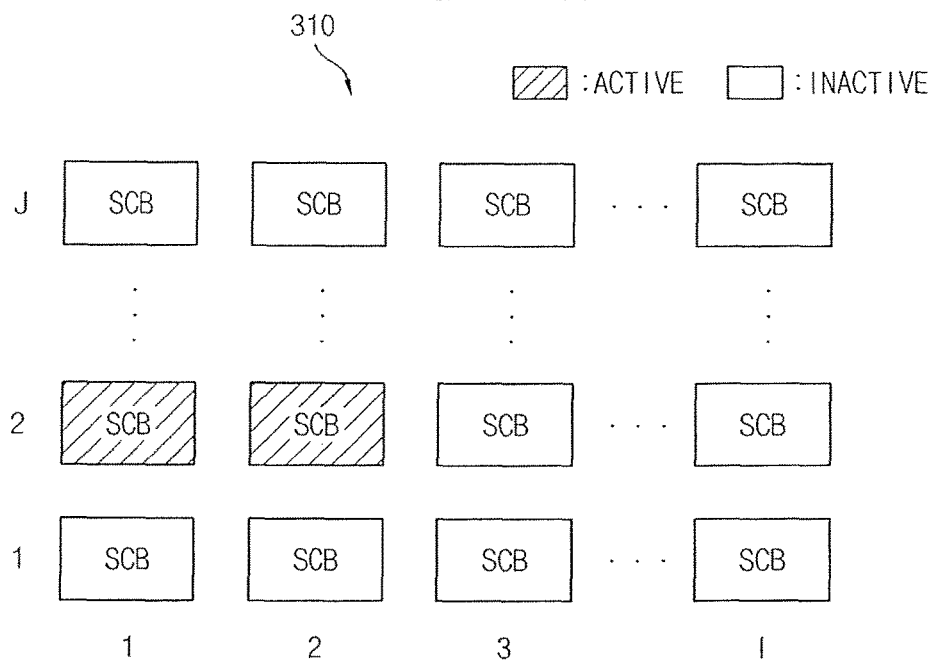
FIGS. 16A and 16B respectively illustrate the first bank array in a test mode of the semiconductor memory device of FIG. 3.
Figure 16B:
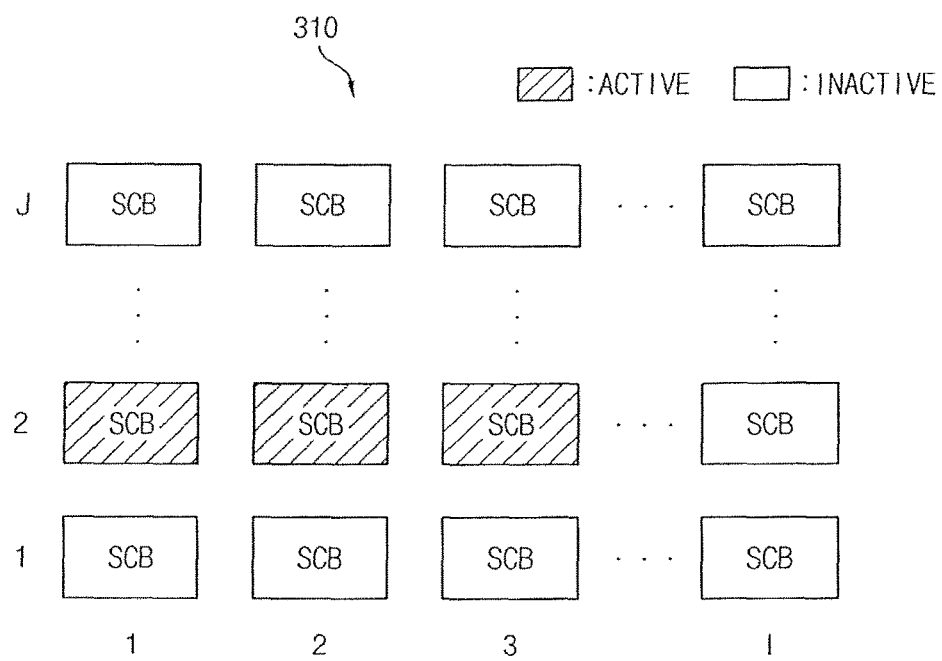

FIGS. 16A and 16B respectively illustrate the first bank array in a test mode of the semiconductor memory device of FIG. 3.

Referring to FIGS. 16A and 16B, in a test mode of the semiconductor memory device 200a, a portion of the sub-array blocks SCB in the first bank array 310 may be activated by using the first and second block selection signals BS and BSB, and memory cells in the activated sub-array blocks may be tested.

In FIG. 16A, two sub-array blocks SCB in a second row of sub-array blocks are activated and in FIG. 16B, three sub-array blocks SCB in a third row of sub-array blocks are activated.

Figure 17:
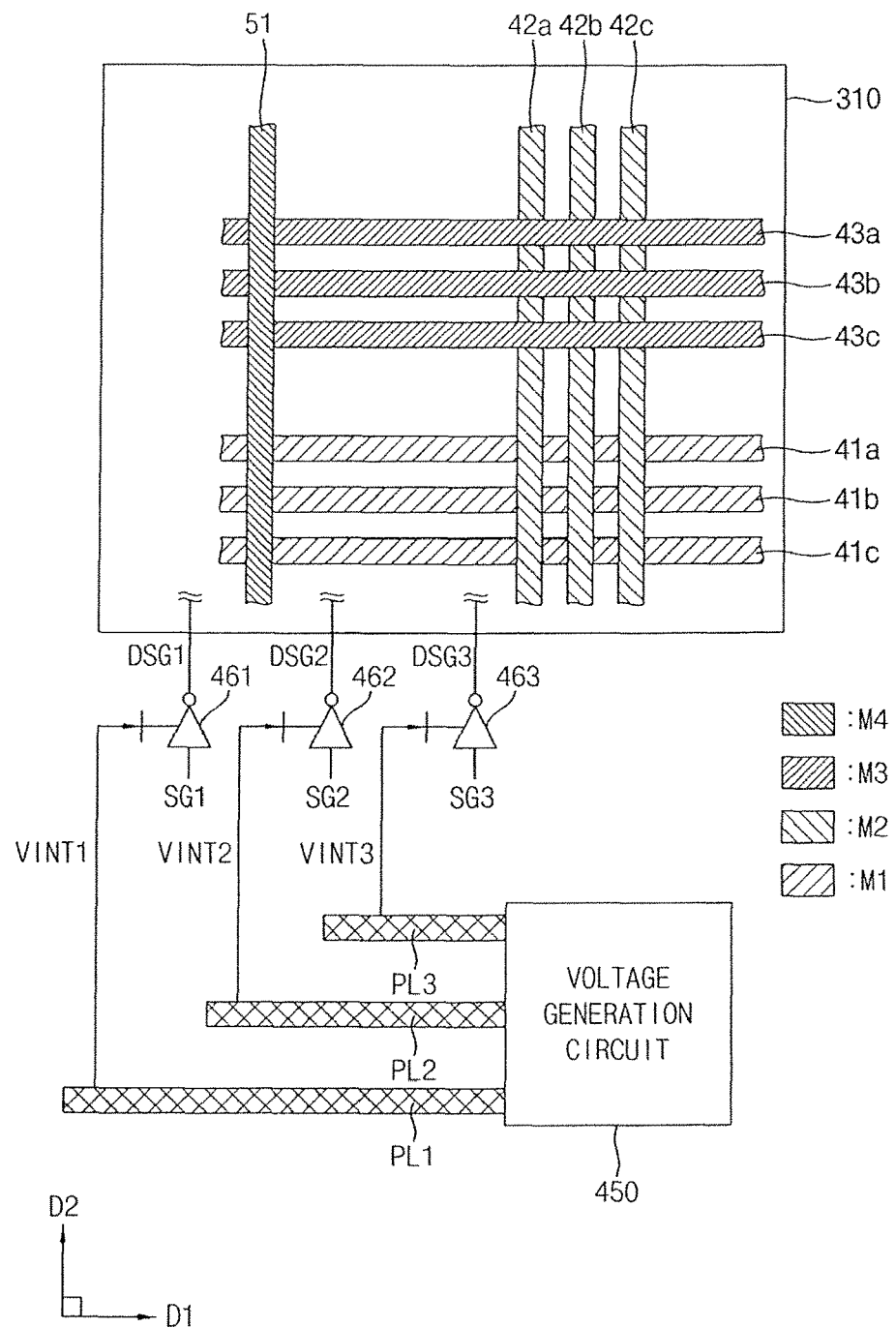
FIG. 17 illustrates the first bank array and the voltage generation circuit in the semiconductor memory device of FIG. 3 according to exemplary embodiments.

FIG. 17 illustrates the first bank array and the voltage generation circuit in the semiconductor memory device of FIG. 3 according to exemplary embodiments of the inventive concept.

Referring to FIGS. 3, 5, 7 and 17, the voltage generation circuit 450 is disposed in the peripheral region PERI of the substrate and drivers 461, 462 and 463 are disposed adjacent the first column decoder 270a in FIG. 7.

The first driver 461 receives a first internal voltage VINT1 from the voltage generation circuit 450 through a first power line PL1, drives a first signal SG1 based on the first internal voltage VINT1 and provides a first driving signal DSG1 to sub-array blocks in the first bank array 310. The second driver 462 receives a second internal voltage VINT2 from the voltage generation circuit 450 through a second power line PL2, drives a second signal SG2 based on the second internal voltage VINT2 and provides a second driving signal DSG2 to the sub-array blocks in the first bank array 310. The third driver 463 receives a third internal voltage VINT3 from the voltage generation circuit 450 through a third power line PL3, drives a third signal SG3 based on the third internal voltage VINT3 and provides a third driving signal DSG3 to sub-array blocks in the first bank array 310.

In the conventional semiconductor memory device, since the drivers 461, 462 and 463 are disposed in the first row decoder 260a, a length of power lines between the voltage generation circuit 450 and the drivers 461, 462 and 463 increases and the core power provided to the core region of the semiconductor memory device does not have a good characteristic. However, in the semiconductor memory device 200a according to exemplary embodiments of the inventive concept, since the drivers 461, 462 and 463 are disposed adjacent to the first column decoder 270a along the second direction D2, the length of the power lines PL1, PL2 and PL3 decreases, and a power mesh to provide powers to the first bank array 310 may be simplified. In addition, the width of each of the power lines PL1, PL2 and PL3 may be increased to provide stable powers.

In addition, first internal power lines 41a, 41b and 41c which extend in the first direction D1 are disposed over the substrate of the first bank array 310, second internal power lines 42a, 42b and 42c which extend in the second direction D2 are disposed over the substrate of the first bank array 310 and third internal power lines 43a, 43b and 43c which extend in the first direction D1 are disposed over the substrate of the first bank array 310.

The first internal power lines 41a, 41b and 41c may be formed in a first metal layer M1 of the semiconductor memory device 200a, the second internal power lines 42a, 42b and 42c may be formed in a second metal layer M2 of the semiconductor memory device 200a, and the third internal power lines 43a, 43b and 43c may be formed in a third metal layer M3 of the semiconductor memory device 200a. The first metal layer M1 is formed over the substrate, the second metal layer M2 is formed over the first metal layer M2 and the third metal layer M3 is formed over the second metal layer M2.

The first internal power lines 41a, 41b and 41c may transfer voltages having different voltage levels, the second internal power lines 42a, 42b and 42c may transfer voltages having different levels, and the third internal power lines 43a, 43b and 43c may transfer voltages having different voltage levels. In addition, the first internal power lines 41a, 41b and 41c may be connected to the second internal power lines 42a, 42b and 42c through vias, and the second internal power lines 42a, 42b and 42c may be connected to the third internal power lines 43a, 43b and 43c through vias.

The first and second control signals CTL1 and CTL2 may be provided to the switching circuits through a signal line 51 that may be formed in a fourth metal layer M4 over the third metal layer M3 from the repeater 280 in FIG. 7.

Therefore, the semiconductor memory device 200a provides timing control signals to control operation of sub-array blocks along the second direction, provides block selection signals associated with selection of the sub-array blocks along the first direction and the switching circuits in the conjunction regions adjacent to the sub-array blocks control a corresponding sub-array block by combining the timing control signals and the block selection signals. Therefore, the core skew may be reduced and effective die area may be increased by reducing a width of a row decoder. In addition, a power mesh over the bank array may be simplified by driving the internal voltages provided from the voltage generation circuit 450 along the second direction.

Figure 18A:
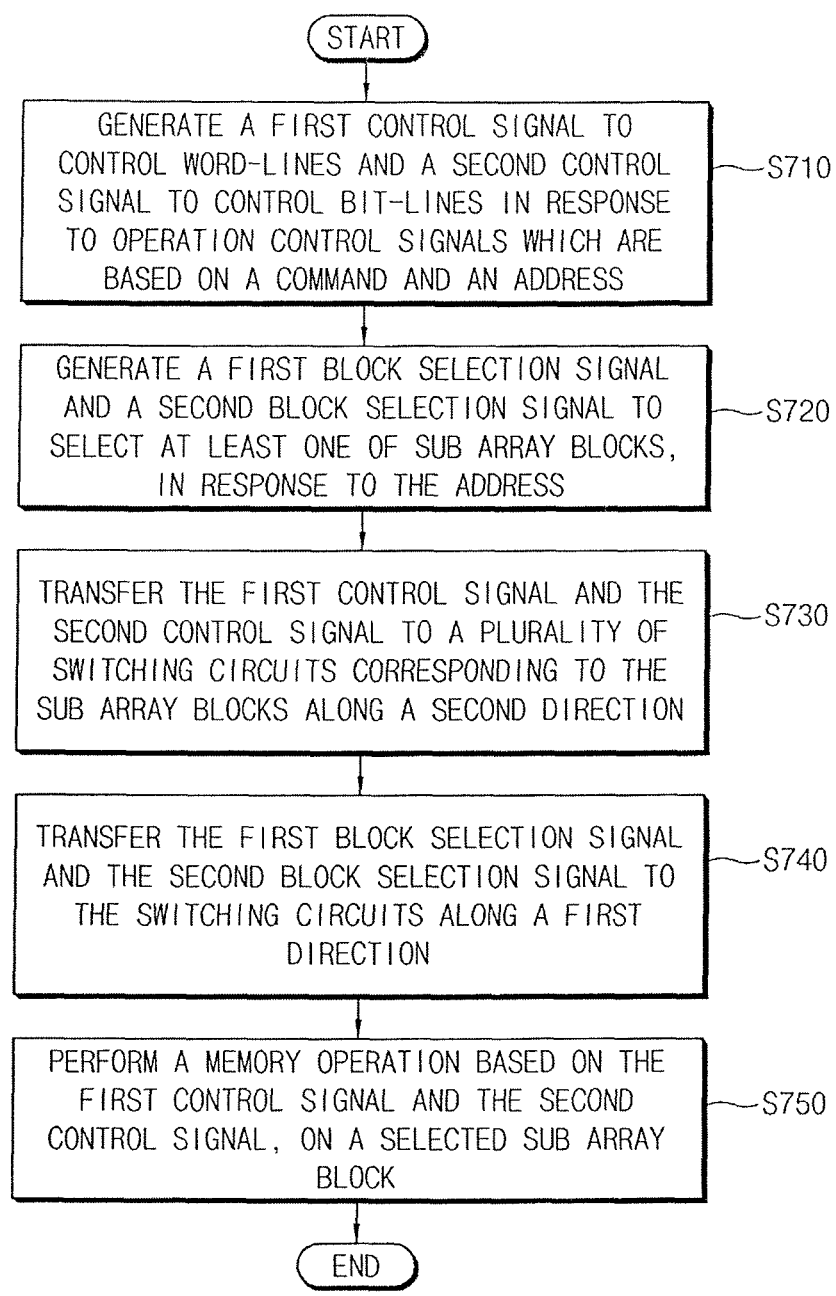
FIG. 18A is a flowchart illustrating a method of operating a semiconductor memory device according to exemplary embodiments of the inventive concept.

FIG. 18A is a flowchart illustrating a method of operating a semiconductor memory device according to exemplary embodiments of the inventive concept.

Referring to FIGS. 2 through 18A, in a method of a semiconductor memory device 200a which includes plurality of bank arrays 310~380 distributed in a core region of a substrate, and each of the bank arrays 310~380 includes a plurality of sub-array blocks SCB disposed in a first direction D1 and a second direction D2 substantially perpendicular to the first direction D1, and includes a plurality of memory cells MC coupled to a plurality of word-lines WL and a plurality of bit-lines BL, a first control signal CTL1 to control the word-lines and a second control signal CTL2 to control the bit-lines are generated in response to operation control signals which are based on a command CMD and an address ADDR from the memory controller 100 (S710).

A first block selection signal BS and a second block selection signal BSB to select at least one of the sub-array block are generated in block coding circuit 261 in the first row decoder 260a, in response to the address ADDR (S720).

The first control signal CTL1 and the second control signal CTL2 are transferred to a plurality of switching circuits 610, 620, 630, and 640 corresponding to the sub-array blocks SCB along the second direction D2 in the repeater 280 (S730). The first control signal CTL1 and the second control signal CTL2 are transferred to the switching circuits 610, 620, 630, and 640 through a signal line formed in a fourth metal layer M4 formed over the substrate. The first block selection signal BS and the second block selection signal BSB are transferred to the switching circuits 610, 620, 630, and 640 along the first direction D2 in the block coding circuits 261 (S740). At least one of the switching circuits 610, 620, 630, and 640 performs on a memory operation based on the first control signal CTL1 and the second control signal CTL2 on a sub-array block selected based on the first block selection signal BS and the second block selection signal BSB (S750).

As discussed herein above, a method of operating a semiconductor memory device provides timing control signals to control operation of sub-array blocks along the second direction, provides block selection signals associated with selection of the sub array blocks along the first direction and the switching circuits in the conjunction regions adjacent to the sub-array blocks control a corresponding sub-array block by combining the timing control signals and the block selection signals. Therefore, the core skew may be reduced and the effective die area may be increased by reducing a width of a row decoder.

Figure 18B:
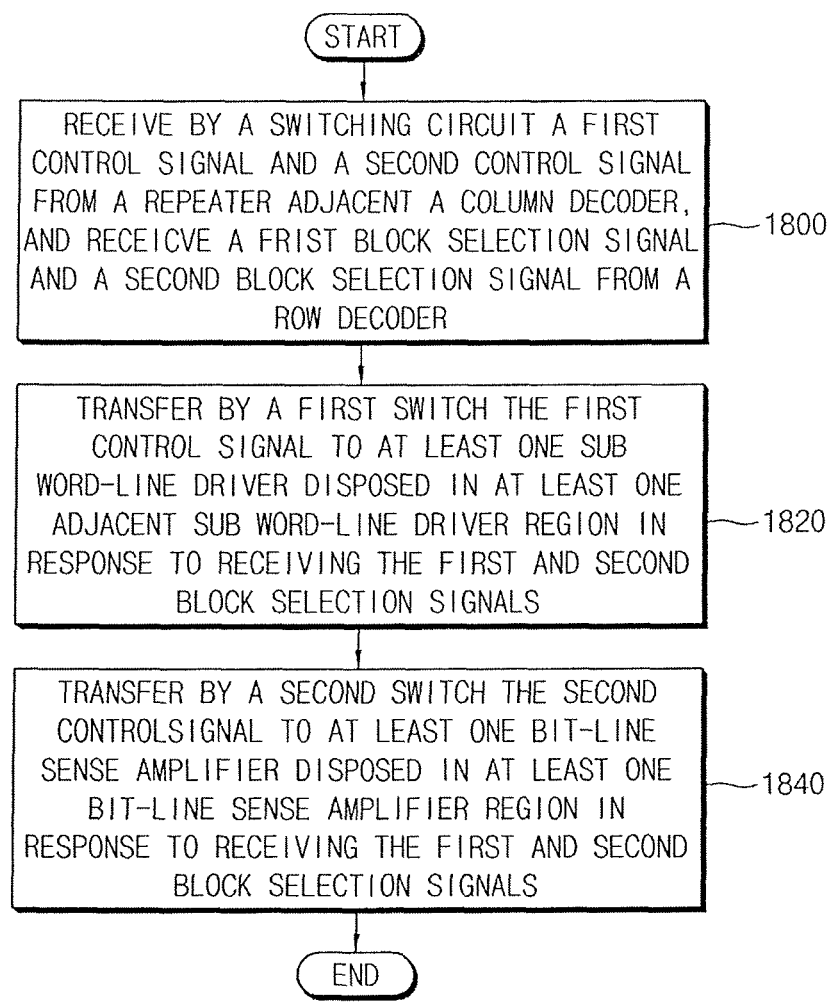
FIG. 18B is a flowchart illustrating the operation of the switching circuits according to the inventive concept.

FIG. 18B illustrates an operation of the switching circuits according to an embodiment of the inventive concept.

At operation 1800, a switch circuit receives a first control signal CTL1 and a second control signal CTL2 from a repeater (e.g. a repeater 280 shown in FIG. 7). The repeater 280 is adjacent a column decoder 270 along a first direction D1 of the bank array 310. In addition a first block selection signal BS and a second selection BSB are output by a row decoder that is adjacent the bank array 310 along the second direction D2 shown in FIG. 7.

At operation 1820 a first switch (CONJ) transfers the first control signal to at least one sub word-line driver disposed in at least one adjacent sub word-line driver region in response to receiving the first and second block selection signals.

At operation 1840, a second switch transfers the second control signal to at least one bit-line sense amplifier disposed in at least one adjacent bit-line sense amplifier region in response to receiving the first and second block selection signals. According to this embodiment of the inventive concept, the block selection signals BS and BSB are provided by the row decoder 260a, but the first control signal CTL1 and the second control signal CTL2 are not, because the repeater 280 receives the first and second control signals from the bank control circuit 283. Alternatively, the repeater may receive the signals from an external device or controller. According to this type of operation, the structure of the row decoder will be smaller in terms of width because the row decoder does not receive and subsequently transmit the first control signal and second control signal, as the repeater performs this operation.

Figure 19:
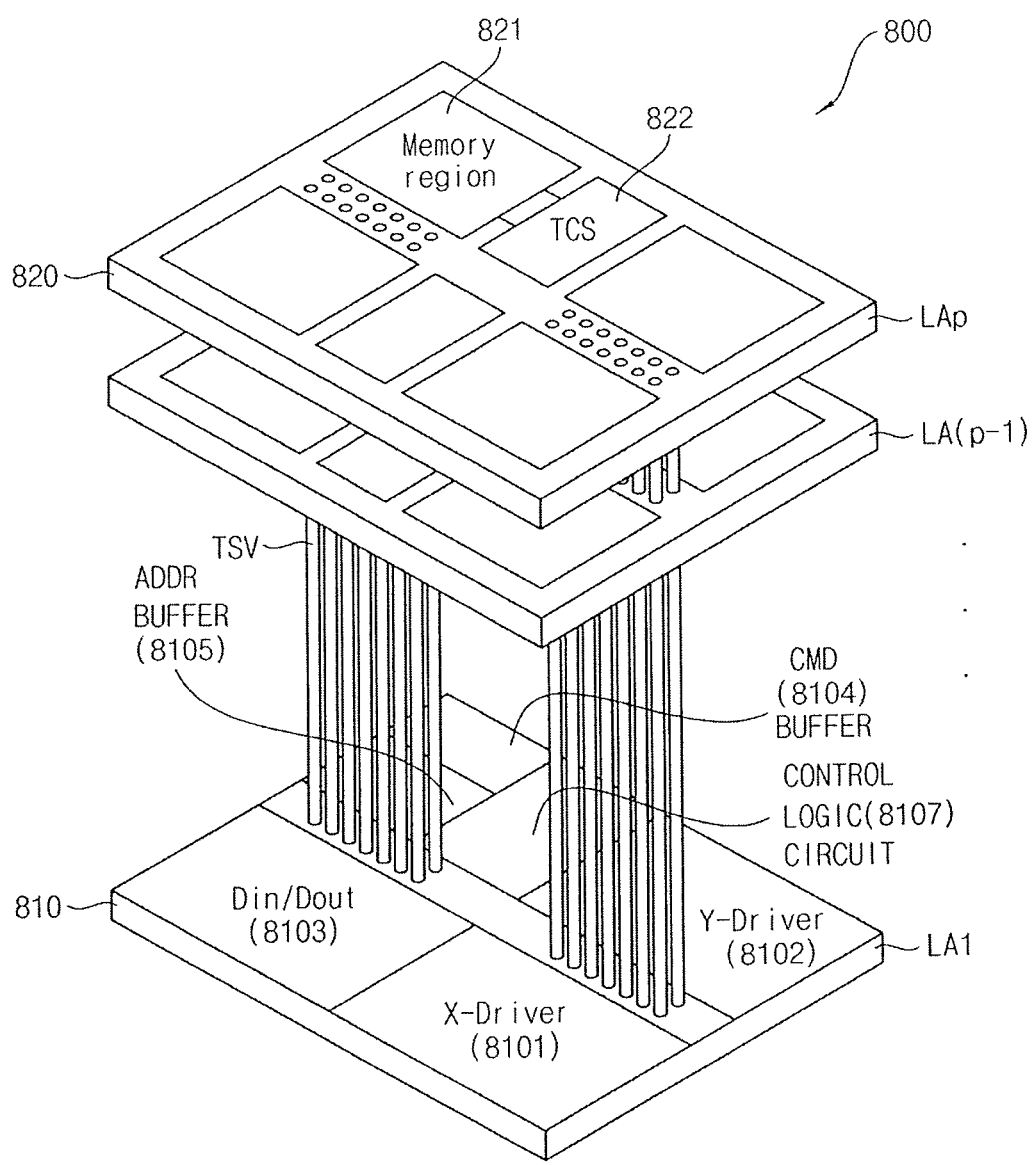
FIG. 19 is a structural diagram illustrating a semiconductor memory device according to exemplary embodiments of the inventive concept.

FIG. 19 is a structural diagram illustrating a semiconductor memory device according to exemplary embodiments of the inventive concept.

Referring to FIG. 19, a semiconductor memory device 800 includes first through p-th semiconductor integrated circuit layers LA1 through LAp (p is a natural number greater than two), in which the lowest first semiconductor integrated circuit layer LA1 is assumed to be an interface or control chip and the other semiconductor integrated circuit layers LA2 through LAp are assumed to be slave chips including core memory chips. The first through p-th semiconductor integrated circuit layers LA1 through LAp may transmit and receive signals there between by through-silicon-vias (TSVs). The lowest first semiconductor integrated circuit layer LA1 being the interface or control chip may communicate with an external memory controller through a conductive structure formed on an external surface. A description will be made regarding structure and an operation of the semiconductor memory device 800 by mainly using the first semiconductor integrated circuit layer LA1 or 810 as the interface or control chip and the p-th semiconductor integrated circuit layer LAp or 820 as the slave chip.

The first semiconductor integrated circuit layer 810 includes various peripheral circuits for driving a memory region 821 provided in the p-th semiconductor integrated circuit layer 820. For example, the first semiconductor integrated circuit layer 810 may include a row (X)-driver 8101 for driving word-lines of a memory, a column (Y)-driver 8102 for driving bit-lines of the memory, a data input/output unit (Din/Dout) 8103 for controlling input/output of data, a command buffer 8104 for receiving a command from outside and buffering the command, and an address buffer 8105 for receiving an address from outside and buffering the address.

The first semiconductor integrated circuit layer 810 further includes a control logic circuit 8107. The control logic circuit 8107 may access the memory region 821 and may generate control signals for accessing the memory region 821 based on the command and address from the memory controller. Conjunction regions are disposed in the memory region 821 and switching circuits are disposed in the conjunction regions.

The p-th semiconductor integrated circuit layer 820 includes the memory region 821 and a timing control circuit 822 and a peripheral region. The timing control circuit 822 controls voltage levels of word-lines and bit-lines coupled to memory cells in the memory region 821. Peripheral circuits such as a row decoder, a column decoder, and a bit-line sense amplifier for writing/reading data in the memory region 821 are disposed in the peripheral region. The timing control circuit 822 may employ the timing control circuit 400 of FIG. 6.

As described with reference to FIGS. 3 through 17, the semiconductor memory device 800 provides timing control signals to the switching circuits along a second direction of the memory region 821 when accessing the memory region 821.

In addition, in some embodiments of the inventive concept, a three dimensional (3D) memory array is provided in semiconductor memory device 800. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

Figure 20:
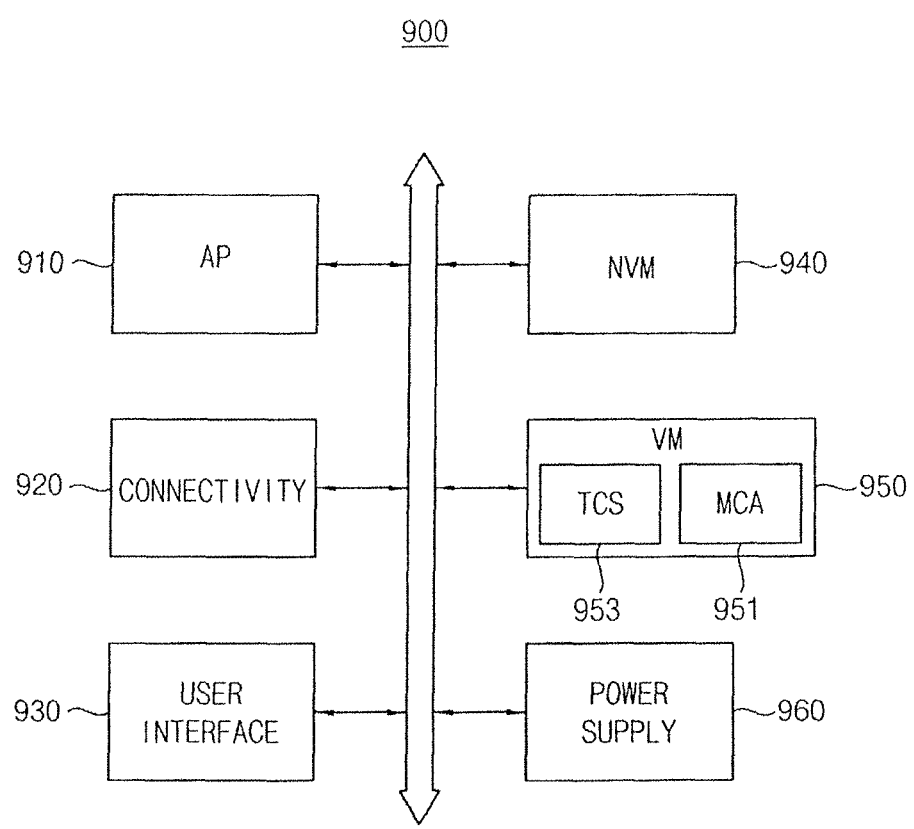
FIG. 20 is a block diagram illustrating a mobile system including the semiconductor memory device according to exemplary embodiments of the inventive concept.

FIG. 20 is a block diagram illustrating a mobile system including the semiconductor memory device according to exemplary embodiments of the inventive concept.

Referring to FIG. 20, a mobile system 900 may include an application processor 910, a connectivity unit 920, a volatile memory device 950, a nonvolatile memory device 940, a user interface 930 and a power supply 960. The application processor may include a memory controller.

The application processor 910 may execute applications, such as a web browser, a game application, a video player, etc. The connectivity unit 920 may perform wired or wireless communication with an external device. The volatile memory device 950 may store data processed by the application processor 910 or operate as a working memory. The volatile memory device 950 may employ the semiconductor memory device 200a of FIG. 3. The volatile memory device 950 includes a memory cell array 951 including memory cells and a timing control circuit 953.

The nonvolatile memory device 940 may store a boot image for booting the mobile system 900. The user interface 930 may include at least one input device, such as a keypad, a touch screen, etc., and at least one output device, such as a speaker, a display device, etc. The power supply 960 may supply a power supply voltage to the mobile system 900.

As discussed herein above, the volatile memory device 950 provides timing control signals to the switching circuits along a second direction of the memory cell array 951 when accessing the memory cell array 951.

The mobile system 900 and components of the mobile system 900 may be mounted on a printed circuit board using a various packages.

According to the inventive concept, each of the repeaters may be disposed adjacent a respective one of the column decoders, and each of the repeaters is configured to transfer the first control signal and the second control signal from the timing control circuit to the sub-array blocks in the second direction without utilizing the row decoders. Therefore, the row decoders may transmit the first block selection signal BS and the second block selection signal BSB associated with the selection of sub-array blocks along the first direction D1. Switching circuits may combine the first control signal CTL1 and the second control signal CTL2 and the first block selection signal BS and the second block selection signal BSB. A row decoder with a decreased with may be realized by utilizing the repeaters to send the first and second control signals CTL1, CTL2 to the switching circuits.

The inventive concept may be applied to devices and systems using semiconductor memory devices. For example, the inventive concept may be applied to systems such as be a mobile phone, a smart phone, a personal digital assistant (PDA), a portable multimedia player (PMP), etc, just to name a few of the devices.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings of the inventive concept. Accordingly, all such modifications are to be included within the scope of the inventive concept as defined in the claims.

What is claimed is:

1. A semiconductor memory device comprising:
a memory cell array including a plurality of bank arrays distributed in a core region of a substrate, wherein each of the bank arrays comprises a plurality of sub-array blocks and includes a plurality of memory cells coupled to a plurality of word-lines and a plurality of bit-lines;
a plurality of row decoders configured to decode a row address of a selected memory cell of the plurality of memory cells and to activate a word-line of the plea of word lines corresponding to the row address, wherein each of the row decoders is disposed adjacent a respective one of the bank arrays in a first direction of the substrate;
a plurality of column decoders configures to decode a column address of the selected memory cell of the plurality of memory cells and to control an input/output gating circuit to output data corresponding to the decoded column address, wherein each of the plurality of column decoders is disposed adjacent a respective one of the bank arrays in a second direction of the substrate that is substantially perpendicular to the first direction;

a timing control circuit disposed in a peripheral region of the substrate, the timing control circuit is configured to generate a first control signal to control the word-lines and a second control signal to control the bit-lines of the selected memory cell in response to received operational control signals based on a command and an address transmitted from a memory controller;

a bank control logic circuit that generates bank control signals to activate one of the plurality of row decoders and one of the plurality of column decoders, the bank control logic circuit configured to receive the first control signal and the second control signal from the timing control circuit; and a plurality of repeaters, wherein each of the repeaters is disposed adjacent a respective one of the column decoders and each of the repeaters is configured to transfer the first control signal and the second control signal from the timing control circuit to the sub-array blocks in the second direction.

2. The semiconductor memory device of claim 1, wherein each of the repeaters is configured to transfer the first control signal and the second control signal through a signal line formed in a fourth metal layer formed over a first through third metal layers, wherein the first through third metal layers are sequentially formed over the substrate, and a plurality of voltages for operation of the sub-array blocks are transferred via the first through third metal layers.

3. The semiconductor memory device of claim 1, wherein each of the bank arrays comprises;

a plurality of the sub-array blocks disposed in the first direction and the second direction;

a plurality of sub word-line driver regions disposed between the sub-array blocks in the first direction;

a plurality of bit-line sense amplifier regions disposed between the sub-array blocks in the second direction; and a plurality of conjunction regions, each of the conjunction regions is disposed adjacent a respective one of the sub word-line driver regions and a respective one of the bit-line sense amplifier regions.

4. The semiconductor memory device of claim 3, further comprising:

a plurality of switching circuits disposed in the conjunction regions, wherein each of the plurality of switching circuits is configured to selectively transfer the first control signal and the second control signal to at least one of the sub-array blocks in response to a first block selection signal and a second block selection signal provided from a corresponding row decoder of the plurality of row decoders.

5. The semiconductor memory device of claim 4, wherein the corresponding row decoder comprises a plurality of Hock coding circuits configured to generate the first block selection signal and the second block selection signal for selecting at least one of the sub-array blocks in response to the address transmitted by the memory controller.

6. The semiconductor memory device of claim 4, wherein each of the plurality of switching circuits comprises:

a first switch configured to transfer the first control signal to at least one sub word-line driver disposed in at least one adjacent sub word-line driver region of the sub word-line driver regions, in response to receiving the first block selection signal and the second block selection signal; and a second switch configured to transfer the second control signal to at least one bit-line sense amplifier disposed in at least one adjacent bit-line sense amplifier region of the bit-line sense amplifier region regions, in response to receiving the first block selection signal and the second block selection signal.

7. The semiconductor memory device of claim 6, wherein the first switch comprises:

a first transistor including a first electrode coupled to the at least one sub word-line driver, a second electrode to receive the first control signal transferred through a first signal line and a gate electrode to receive the first block selection signal; and a second transistor including a first electrode coupled to the at least one sub word-line driver, a second electrode coupled to a ground voltage and a gate electrode to receive the second block selection signal.

8. The semiconductor memory device of claim 6, wherein the second switch comprises:

a first transistor including a first electrode coupled to the at least one bit-line sense amplifier, a second electrode that receives the second control signal transferred through a second signal line and a gate electrode that receives the first block selection signal; and a second transistor including a first electrode coupled to the at least one bit-line sense amplifier, a second electrode coupled to a ground voltage and a gate electrode to receive the second block selection signal.

9. The semiconductor memory device of claim 6, wherein the first control signal and the second control signal have different logic levels with respect to each other.

10. The semiconductor memory device of claim 6, wherein a first sub-array block of the sub-array blocks is selected in response to the first block selection signal and a second sub-array block of the sub-array blocks is deselected in response to the second block selection signal.

11. The semiconductor memory device of claim 1, further comprising a voltage generator disposed in the peripheral region, wherein the voltage generator is configured to generate a plurality of voltages to provide the plurality of voltages to the sub-array blocks via a first metal layer, a second metal layer and a third metal layer.

12. The semiconductor memory device of claim 11, further comprising:

at least a first driver configured to receive a first internal voltage of the plurality of voltages through a first power line connected to the voltage genera or and configured to provide to the sub-array blocks;

at least a second driver configured to receive a second internal voltage of the plurality of voltages through a second power line connected to the voltage generator and configured to provide to the sub-array blocks; and at least a third driver configured to receive a third internal voltage of the plurality of voltages through a third power line connected to the voltage generator and configured to provide the third internal voltage to the sub-array blocks.

13. The semiconductor memory device of claim 12, wherein the first driver, the second driver and the third driver are disposed adjacent a corresponding column decoder in the second direction, of the column decoders.

14. The semiconductor memory device of claim 11, wherein the first metal layer, the second metal layer and the third metal layer are disposed in the first direction and the second direction over a corresponding bank array of the bank arrays, and wherein a fourth metal layer is disposed in the second direction over the corresponding bank array.

15. The semiconductor memory device of claim 1, wherein a first width of each of the column decoders in the second direction is greater than a second width of each of the row decoders in the first direction, and Wherein each of the memory cells comprises a dynamic memory cell or a resistive-type memory cell.

16. A method of operating a semiconductor memory device, wherein the semiconductor memory device comprises a memory cell array including a plurality of bank arrays distributed in a core region of a substrate, and each of the bank arrays comprises a plurality of sub-array blocks disposed in a first direction and a second direction substantially perpendicular to the first direction and includes a plurality of memory cells coupled to a plurality of word-lines and a plurality of bit-lines, the method comprising:

generating a first control signal to control the word-lines and a second control signal to control the bit-lines in response to receiving operational control signals based on a command and an address;

generating a first block selection signal and a second block selection signal to select at least one of the sub-array blocks, in response to receiving the address;

transferring the first control signal and the second control signal to a plurality of switching circuits corresponding to the sub-array blocks along the second direction;

transferring the first block selection signal and the second block selection signal to the plurality of switching circuits along the first direction; and performing a memory operation based on the first control signal and the second control signal, on a selected sub-array block which is selected via a plurality of switching circuits in response to the first block selection signal and the second block selection signal from a corresponding row decoder of a plurality of row decoders each disposed adjacent a respective one of the plurality of bank arrays in a first direction of the substrate.

17. The method of claim 16, wherein the first control signal and the second control signal are transferred to the sub-array blocks via a fourth metal layer formed over a first metal layer, a second metal layer and a third metal layer, wherein the first metal layer, the second metal layer and the third metal layer are sequentially formed over the substrate, and a plurality of voltages for operation of the sub-array blocks are transferred via the first metal layer, the second metal layer and the third metal layer.

18. The method of claim 16, wherein in a test mode of the semiconductor memory device, a portion of a row of the sub-array blocks in the first direction are activated in response to the first block selection signal and the second block selection signal.

19. A semiconductor memory device comprising:

a memory cell array including a plurality of bank arrays distributed in a core region of a substrate, wherein each of the bank arrays comprises a plurality of sub-array blocks and includes a plurality of memory cells coupled to a plurality of word-lines and a plurality of bit-lines;

a plurality of row decoders configured to decode a row address of a selected memory cell of the plurality of memory cells and to activate a word-line of the plurality of word-lines corresponding to the row address, wherein each of the plurality of row decodes is disposed adjacent a respective one of the bank arrays in a first direction of the substrate;

a plurality of column decoders configured to decode a column address of the selected memory cell of the plurality of memory cells and to control an input/output gatin circuit to output data corresponding to the decode column address, wherein each of the column decoders is disposed adjacent a respective one of the bank arrays in a second direction of the substrate that is substantially perpendicular to the first direction;

a timing control circuit configured to generate a first control signal to control the word-lines and a second control signal to control the bit-lines of the selected memory cell in response to received operational control signals received from an external controller;

a bank control circuit that receives the first control signal and the second control signal from the timing control circuit and generates a decoding signal in response to receiving a row address that is provided to a first row decoder of the plurality of row decoders and a column address that is provided to a first column decoder of the plurality of column decoders;

a plurality of repeaters, wherein each of the repeaters is disposed adjacent a respective one of the column decoders and each of the repeaters is configured to transfer the first control signal and the second control signal received from the bank control circuit to the sub-array blocks in the second direction, and wherein the first row decoder provides a first block selection signal and a second block selection signal associated with selection of the sub-array blocks along the first direction.

20. The semiconductor memory device of claim 19, wherein the plurality of bank arrays are included in a three-dimensional memory cell array.

* * * * *